US009485336B2

(12) United States Patent
Shinoda

(10) Patent No.: US 9,485,336 B2
(45) Date of Patent: Nov. 1, 2016

(54) WATERPROOF STRUCTURE AND ELECTRONIC APPARATUS

(71) Applicant: FUJITSU LIMITED, Kawasaki-shi, Kanagawa (JP)

(72) Inventor: Takao Shinoda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 24 days.

(21) Appl. No.: 14/602,409

(22) Filed: Jan. 22, 2015

(65) Prior Publication Data

US 2015/0230356 A1 Aug. 13, 2015

(30) Foreign Application Priority Data

Feb. 13, 2014 (JP) ................................ 2014-025665

(51) Int. Cl.

*H04M 1/02* (2006.01)
*G06F 1/16* (2006.01)
*H01R 13/52* (2006.01)
*H04M 1/18* (2006.01)
(Continued)

(52) U.S. Cl.

CPC .......... *H04M 1/0202* (2013.01); *G06F 1/1656* (2013.01); *H01R 13/5213* (2013.01); *H04B 1/3888* (2013.01); *H04M 1/18* (2013.01); *H05K 5/0239* (2013.01); *H01R 2201/16* (2013.01); *H04B 2001/3894* (2013.01); *H04M 1/0274* (2013.01)

(58) Field of Classification Search

CPC .. H04M 1/0202; H04M 1/18; H04M 1/0274; G06F 1/1656; H01R 13/5213; H01R 2201/16; H05K 5/0239; H04B 1/3888; H04B 2001/3894

See application file for complete search history.

(56) References Cited

U.S. PATENT DOCUMENTS

| | | | | | |
|---|---|---|---|---|---|
| 4,383,743 | A * | 5/1983 | Nozawa | G03B 17/08 | 396/29 |
| 7,050,712 | B2 * | 5/2006 | Shimamura | G03B 17/08 | 206/316.2 |
| 8,544,643 | B2 * | 10/2013 | Yim | G03B 17/08 | 206/316.2 |

(Continued)

FOREIGN PATENT DOCUMENTS

| | | | |
|---|---|---|---|
| EP | 1 452 947 | A1 | 9/2004 |
| JP | 5-57878 | U | 7/1993 |

(Continued)

OTHER PUBLICATIONS

Extended European Search Report dated Jun. 25, 2015, issued in counterpart application No. 15152644.9 (8 pages).

*Primary Examiner* — Brandon Miller
(74) *Attorney, Agent, or Firm* — Westerman, Hattori, Daniels & Adrian, LLP

(57) ABSTRACT

A waterproof structure includes a body member, a lid member that includes a waterproof member that inhibits water from entering through the opening, a guide member and in which a shaft hole including a circular hole portion and a long hole portion communicating with the circular hole portion is formed, a shaft section that is provided in the lid member, is supported in the shaft hole, is rotated inside the circular hole portion, is regulated in the rotation thereof inside the long hole portion, and is guided to the body member side, a first biasing section that biases the shaft section in a removing direction away from the body member, a second biasing section that biases the shaft section in a rotation direction, and a locking member that locks the lid member to the body member in a state where the waterproof member inhibits water from entering through the opening.

16 Claims, 29 Drawing Sheets

(51) Int. Cl.

| | |
|---|---|
| ***H04B 1/38*** | (2015.01) |
| ***H05K 5/02*** | (2006.01) |
| ***H04B 1/3888*** | (2015.01) |

(56) References Cited

U.S. PATENT DOCUMENTS

| | | | | |
|---|---|---|---|---|
| 9,172,781 | B1 * | 10/2015 | Goldstein | H04M 1/0202 |
| 2006/0046542 | A1 | 3/2006 | Obara et al. | |
| 2010/0265388 | A1 * | 10/2010 | Soumi | G03B 17/02 348/374 |
| 2013/0293073 | A1 * | 11/2013 | Tsai | H05K 5/061 312/229 |
| 2014/0353179 | A1 * | 12/2014 | Kim | A45C 11/00 206/37 |

FOREIGN PATENT DOCUMENTS

| | | | | |
|---|---|---|---|---|
| JP | EP 1452947 | A1 * | 9/2004 | E05B 1/0038 |
| JP | 2006-66310 | A | 3/2006 | |
| JP | 2009-5113 | A | 1/2009 | |
| WO | 2007/069552 | A1 | 6/2007 | |

* cited by examiner

WATERPROOF STRUCTURE AND ELECTRONIC APPARATUS

CROSS-REFERENCE TO RELATED APPLICATION

This application is based upon and claims the benefit of priority from the prior Japanese Patent Application No. 2014-025665, filed on Feb. 13, 2014, the entire contents of which are incorporated herein by reference.

FIELD

The embodiments discussed herein are related to a waterproof structure and an electronic apparatus.

BACKGROUND

In the related art, there is an electronic apparatus in which an opening formed in a case is opened and closed through a two-step operation of a cover. For example, the technology is disclosed in Japanese Laid-open Utility Model Publication No. 5-57878.

SUMMARY

According to an aspect of the invention, a waterproof structure includes a body member in which an opening is formed, a lid member that includes a waterproof member that inhibits water from entering through the opening, a guide member which is provided in the body member and in which a shaft hole including a circular hole portion and a long hole portion communicating with the circular hole portion is formed, a shaft section that is provided in the lid member, is supported in the shaft hole, is rotated inside the circular hole portion, is regulated in the rotation thereof inside the long hole portion, and is guided to the body member side, a first biasing section that biases the shaft section in a removing direction away from the body member, a second biasing section that biases the shaft section in a rotation direction, and a locking member that locks the lid member to the body member in a state where the waterproof member inhibits water from entering through the opening.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An embodiment of the technology disclosed in this application will be described.

Figure 1:
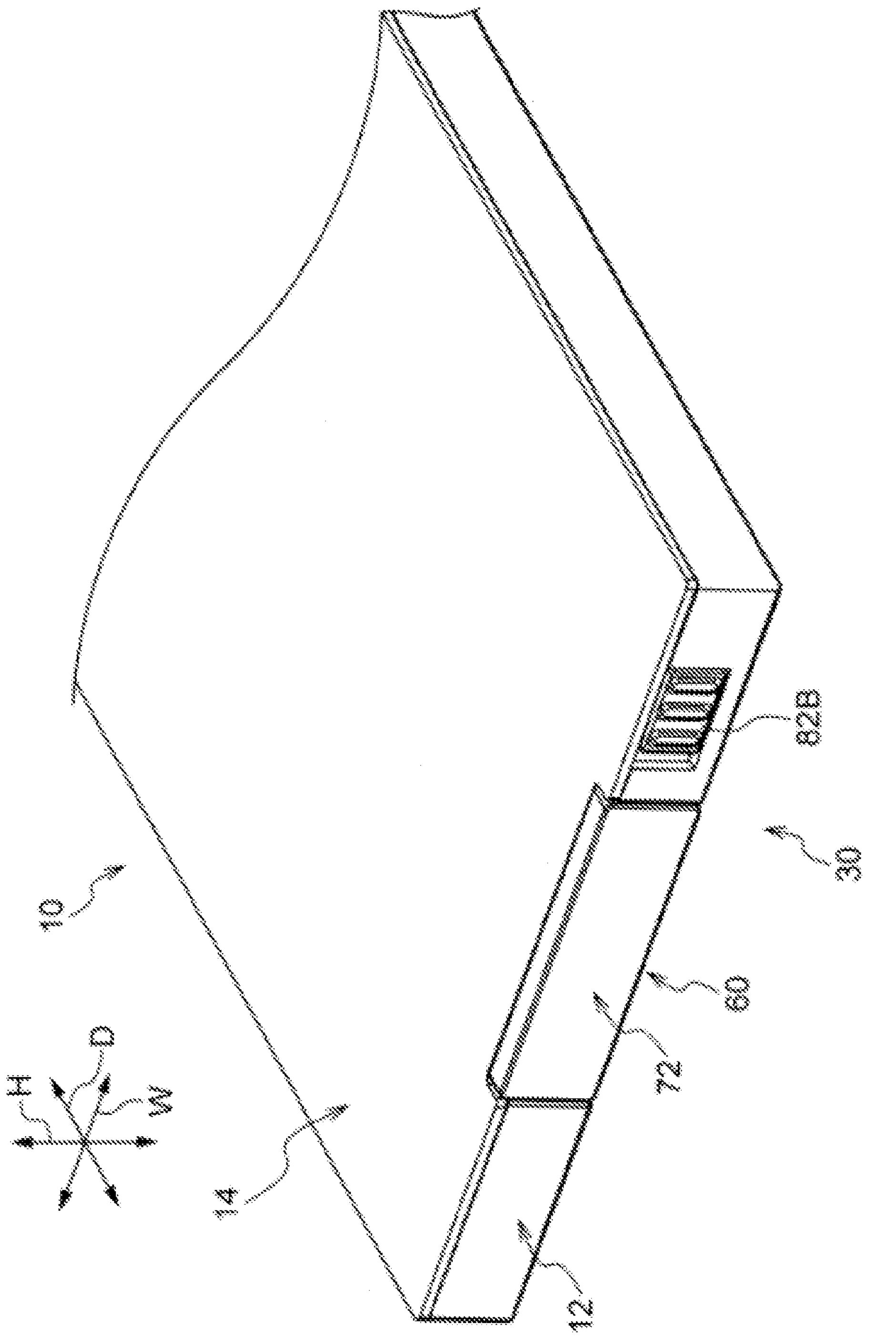
FIG. 1 is a partial perspective view of a smartphone according to an embodiment.

FIG. 1 illustrates a smartphone 10 as an example of an electronic apparatus. The smartphone 10 has a housing 12, a touch panel 14, a lid open-close section 30 as an example of a waterproof structure, and an electronic unit 22 (see FIG. 2).

Case

Figure 2:
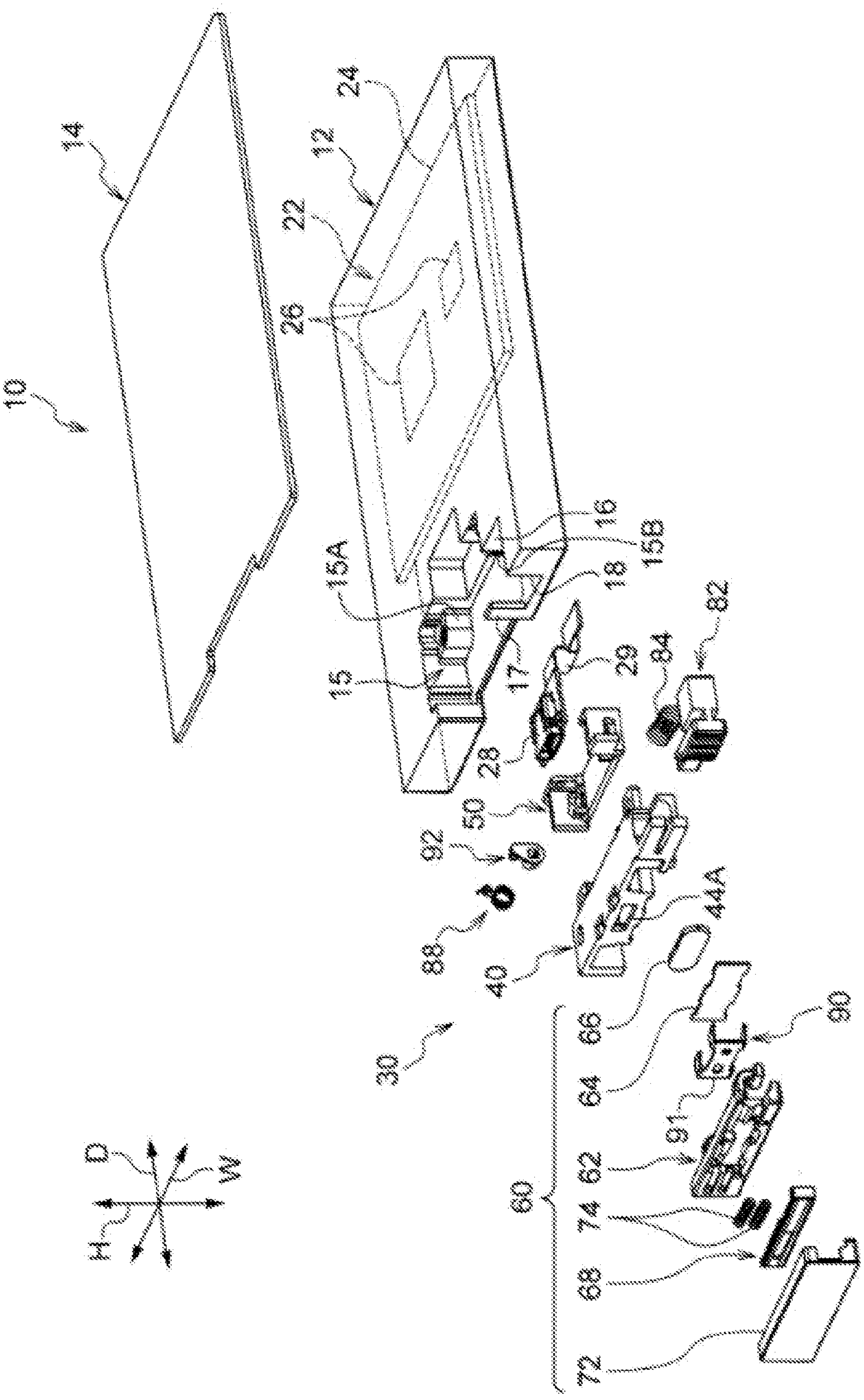
FIG. 2 is an exploded perspective view of the smartphone according to the embodiment.

As illustrated in FIG. 2, as an example, the housing 12 is formed in a flat rectangular parallelepiped box shape. Moreover, in the drawings, in a state where the touch panel 14 is disposed on the upper side and the lid open-close section 30 is disposed on the front side, a depth direction, a width direction, and a height direction of the housing 12 are respectively indicated as arrow D, arrow W, and arrow H. The depth direction, the width direction, and the height direction are directions for the convenience of description and are not intended to limit a using state of the smartphone 10.

Furthermore, in the following description, the depth direction, the width direction, and the height direction are referred to as a D direction, a W direction, and an H direction. The D direction, the W direction, and the H direction are orthogonal to each other. The D direction is an example of a removing direction and the W direction is an example of an intersecting direction. In the D direction, when distinguishing one side from the other side, the sides are referred to as the front side and the back side. In the W direction, when distinguishing one side from the other side, the sides are referred to as the left side and the right side. In the H direction, when distinguishing one side from the other side, the sides are referred to as the upper side and the lower side. A horizontal direction of the housing 12 includes the D direction and the W direction.

Figure 4:
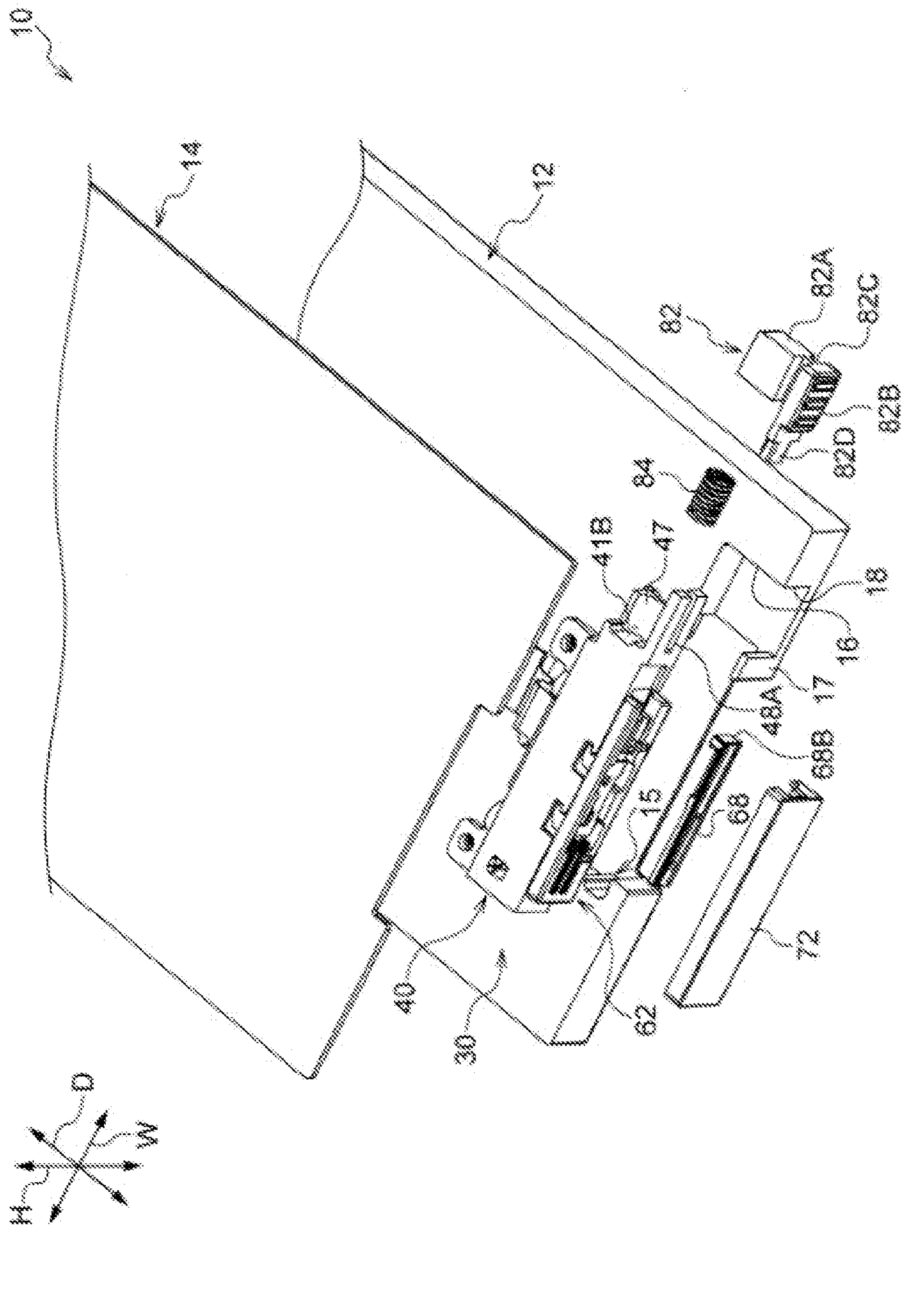
FIG. 4 is a partial exploded perspective view of a lid section and a portion of a periphery of the lid section according to the embodiment.

A first concave section 15 that is recessed from a center in the W direction to the back side in the D direction and a second concave section 16 that is recessed from the first concave section 15 to the right side in the W direction are formed on the front side of the housing 12. Fastened sections 15A and 15B to which a fastening section 49 (see FIG. 5) described below is fastened are formed in the first concave section 15. Furthermore, as illustrated in FIG. 4, a side wall 17 of the second concave section 16 is formed on the front side of the housing 12 in the D direction and on the right side in the W direction. A window section 18 notched downward from an upper end portion of the side wall 17 is formed in the side wall 17.

Electronic Unit

As illustrated in FIG. 2, the electronic unit 22 for controlling an operation of each section of the smartphone 10 is accommodated in the housing 12. The electronic unit 22 has a board 24 in which a predetermined circuit pattern is formed. The board 24 is equipped with a plurality of electronic components 26. As an example, a jack 28 of a Universal Serial Bus (USB) is electrically connected to some of the plurality of electronic components 26 through a flexible flat cable 29. The jack 28 is an example of a connection member. Furthermore, the end portion of the jack 28 on the front side in the D direction is disposed further toward the back side than an opening 44A of a body member 40 described below. Moreover, a plug (not illustrated) of a USB cable is connected to the jack 28 in an open state of the opening 44A.

Touch Panel

The touch panel 14 is formed in a rectangular shape viewed from the H direction and is mounted on the upper portion of the housing 12 in the H direction. In a mounting state of the touch panel 14 on the housing 12, the first concave section 15 and the second concave section 16 are covered by the touch panel 14. Furthermore, the touch panel 14 serves as a display for displaying information and is electrically connected to a circuit of the electronic unit 22 through a cable (not illustrated). Moreover, a display for displaying the information, an operation panel for an input operation, or operation buttons may be provided instead of the touch panel 14.

Lid Open-Close Section

Figure 3:
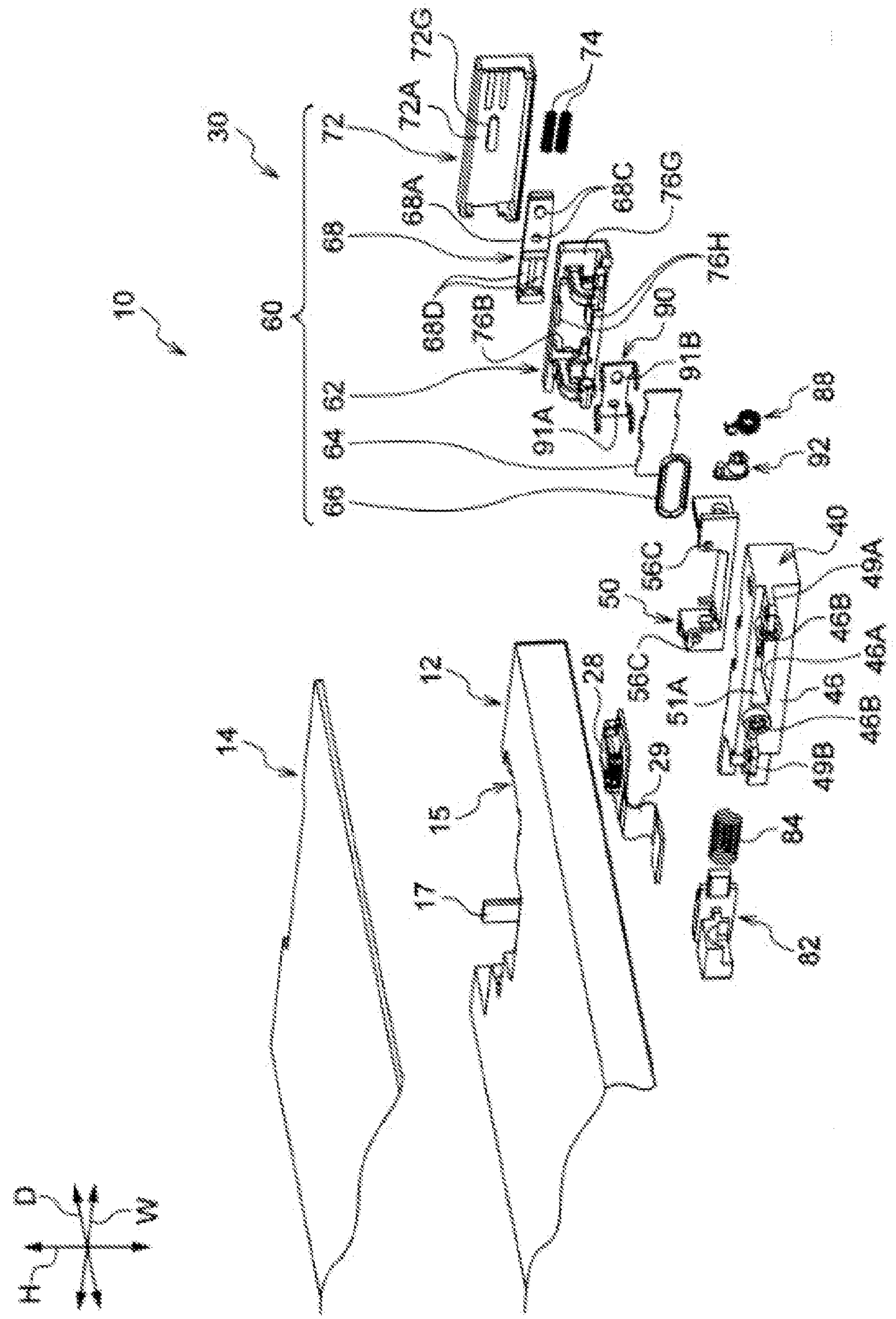
FIG. 3 is an exploded perspective view of the smartphone according to the embodiment.

As illustrated in FIGS. 2 and 3, the lid open-close section 30 has the body member 40, a guide frame 50, a lid section 60, a lock knob 82, a torsion spring 88, and a lock member 90. The guide frame 50 is an example of a guide member. The lid section 60 is an example of a lid member. The lock knob 82 is an example of a releasing member. The lock member 90 is an example of a locking member.

Body Member

Figure 5:
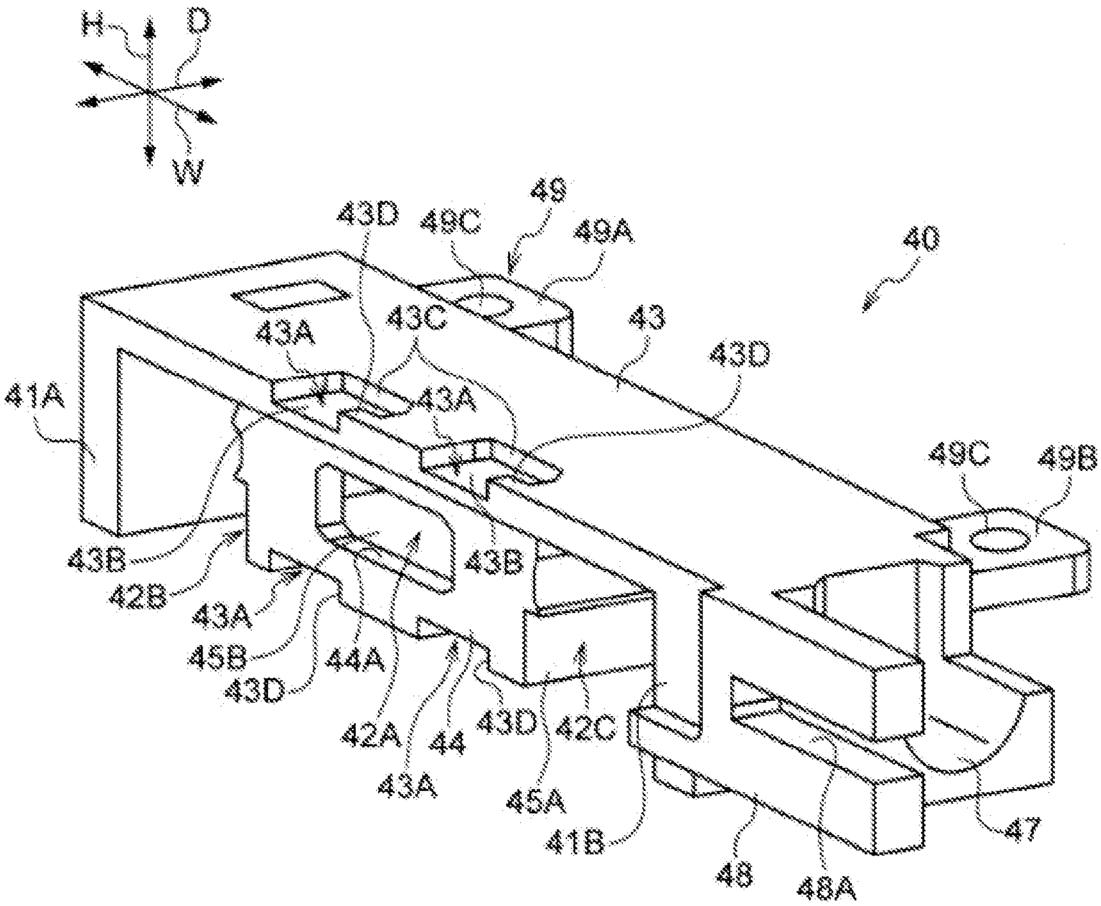
FIG. 5 is a perspective view of a body member according to the embodiment.

As illustrated in FIG. 5, as an example, the body member 40 has a left side wall 41A, a right side wall 41B, an upper wall 43, a first front wall 44, an inside wall 45A, a bottom wall 45B, and a back wall 46 (see FIG. 3). Furthermore, the body member 40 has a spring arrangement section 47 that is integrally formed in the right side wall 41B, a second front wall 48 that is formed on the front side of the spring arrangement section 47, and the fastening section 49 that protrudes backward from the back wall 46.

The left side wall 41A and the right side wall 41B have square shapes viewed from the W direction and have the same size. Furthermore, the left side wall 41A and the right side wall 41B are disposed along a D-H surface and at an interval in the W direction. The upper wall 43 is formed in a rectangular shape in which the D direction is a lateral direction and the W direction is a longitudinal direction viewed in a plan view (viewed in the H direction). Then, the upper wall 43 is disposed along a D-W surface and connects an end portion of the left side wall 41A on the upper side and an end portion of the right side wall 41B on the upper side. Furthermore, as an example, inserted sections 43A of a total of four by two at an interval in the W direction is formed in the upper portion of the upper wall 43 on the front side in the D direction in the center in the W direction, and the lower portion of the bottom wall 45B on the front side in the D direction in the center in the W direction.

The inserted section 43A is a groove on the upper side in the H direction and on the front side in the D direction or a groove on the lower side in the H direction and on the front side in the D direction, and has a bottom surface 43B and an inside wall 43C. The bottom surface 43B is along the W-D surface. The inside wall 43C is a wall upright along the H direction on the left side, the back side, and the right side in the periphery of the bottom surface 43B. Furthermore, a locked section 43D protruding toward the left side of the inside wall 43C is formed in a portion on the right side and on the front side of the inside wall 43C. In other words, the locked section 43D is formed in the upper wall 43 by cutting an L shape that is rotated on the right side by 90 degrees in a plan view.

The first front wall 44 is a wall extending downward along the W-H surface from the front side in the D direction in the center portion of the upper wall 43 in the W direction. Furthermore, the opening 44A is formed in the first front wall 44. The opening 44A is positioned in the center in the H direction and the W direction of the first front wall 44, and passes through in the D direction. Furthermore, the opening 44A is formed in a rectangular shape that is long in the W direction viewed in the D direction. Furthermore, the opening 44A has a size such that the end portion of the jack 28 (see FIG. 2) on the front side in the D direction is exposed on the front side in the D direction.

The inside wall 45A extends from both end portions of the first front wall 44 in the W direction to the back wall 46 (see FIG. 3) on the lower side of the upper wall 43. Furthermore, the bottom wall 45B connects lower end portions of two inside wall 45A along the upper wall 43. Here, an opening 46A (see FIG. 3) is formed in the back wall 46. Then, a first chamber section 42A surrounded by the bottom wall 45B, the inside wall 45A, and the upper wall 43 is configured such that the front side thereof communicates with the outside through the opening 44A and the back side communicates with the outside through the opening 46A. The first chamber section 42A has a size such that the jack 28 (see FIG. 2) is disposed.

A second chamber section 42B surrounded by the left side wall 41A, the inside wall 45A, the upper wall 43, and the back wall 46 (see FIG. 3) is configured such that the front side in the D direction and the lower side in the H direction are open. Furthermore, a third chamber section 42C surrounded by the right side wall 41B, the inside wall 45A, the upper wall 43, and the back wall 46 is configured such that the front side in the D direction and the lower side in the H direction are open. A left side wall 52 (see FIG. 6) of the guide frame 50 described below is inserted into the second chamber section 42B and a right side wall 53 (see FIG. 6) of the guide frame 50 described below is inserted into the third chamber section 42C.

The spring arrangement section 47 is a concave section that protrudes on the right side from the lower side of the center of the right side wall 41B in the H direction to the right side in the W direction and is recessed in an arc shape on the lower side in the H direction. Furthermore, the spring arrangement section 47 has a size to accommodate a coil spring 84 (see FIG. 3).

The second front wall 48 is a planar portion extending from the right end of the first front wall 44 in the W direction to the right side. Furthermore, the second front wall 48 has a linear groove 48A that is formed in a C shape viewed in a front view (viewed in the D direction) and extends from the center to the right side in the W direction. A connection section 82C of the lock knob 82 (see FIG. 14) described below is inserted into the groove 48A. Thus, the lock knob 82 is supported and guided by the second front wall 48.

The fastening section 49 has plate-like sections 49A and 49B respectively protruding from both end portions to the back side of the back wall 46 (see FIG. 3) in the W direction. In the plate-like sections 49A and 49B, the H direction is a thickness direction of the plate. Furthermore, fastening holes 49C passing through in the H direction are formed in the plate-like sections 49A and 49B. Here, the plate-like sections 49A and 49B are fastened to the fastened sections 15A and 15B (see FIG. 2) by screws (not illustrated) and thereby the body member 40 is fixed to the first concave section 15 (see FIG. 2). Moreover, as illustrated in FIG. 3, two fastening holes 46B passing through in the D direction are formed in portions further toward inside than the plate-like sections 49A and 49B and further toward outside than the opening 46A in the back wall 46.

Guide Frame

Figure 6:
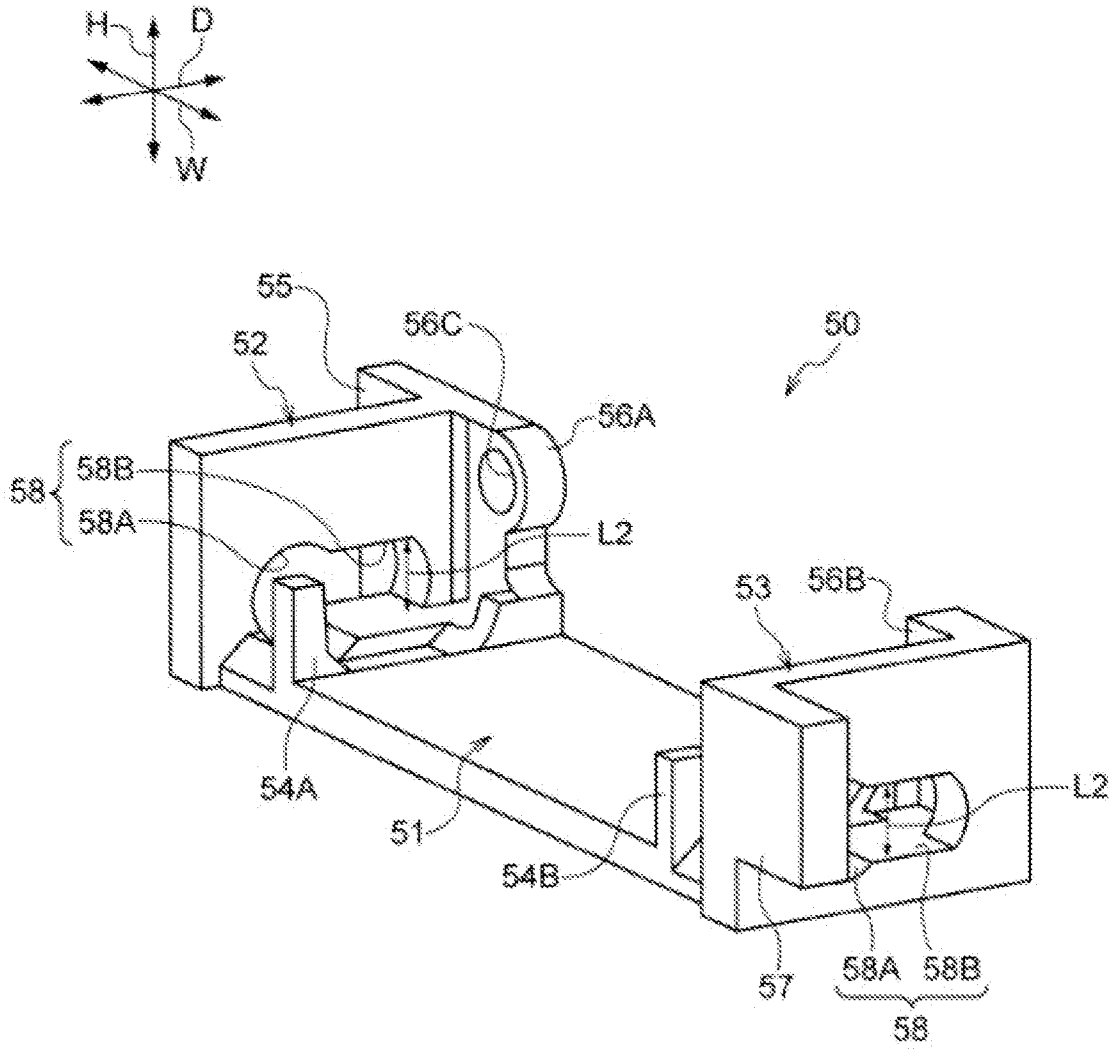
FIG. 6 is a perspective view of a guide frame according to the embodiment.

As illustrated in FIG. 6, the guide frame 50 has a bottom wall 51, a left side wall 52, the right side wall 53, protrusion sections 54A and 54B, a first back wall 55, second back walls 56A and 56B, and a right front wall 57. The left side wall 52 is an example of a wall section. The first back wall 55 is an example of an extension section.

The bottom wall 51 is a rectangular shape in which the W direction is the longitudinal direction and the D direction is the lateral direction, and is formed in a plate shape. The left side wall 52 is formed in a plate shape in which the W direction is the thickness direction and is upright in the left end of the bottom wall 51 in the W direction and a portion of the upper side in the H direction along the D-H surface. The right side wall 53 is formed in a plate shape in which the W direction is the thickness direction and is upright in the right end of the bottom wall 51 in the W direction and a portion of the upper side in the H direction along the D-H surface. Shaft holes 58 passing through in the W direction are respectively formed in the left side wall 52 and the right side wall 53. The shaft hole 58 of the left side wall 52 and the shaft hole 58 of the right side wall 53 are formed in the same position viewed in the W direction.

The shaft hole 58 includes a circular hole portion 58A and a long hole portion 58B. The circular hole portion 58A is formed on the front side in the D direction. Furthermore, a diameter of the circular hole portion 58A is greater than those of curved surfaces 77G and 77I (see FIG. 8) and curved surfaces 78G and 78I (see FIG. 10) described below. The long hole portion 58B communicates with the circular hole portion 58A further toward back side than the circular hole portion 58A in the D direction. Furthermore, the long hole portion 58B is a hole that is long in the diameter direction of the circular hole portion 58A and in the D direction. Furthermore, a width L2 of the long hole portion 58B in the H direction is smaller than the diameter of the circular hole portion 58A.

The protrusion section 54A and the protrusion section 54B are portions of prismatic shapes protruding upward on the front side on the bottom wall 51 between the left side wall 52 and the right side wall 53. Furthermore, heights of the protrusion section 54A and the protrusion section 54B are lower than those of the left side wall 52 and the right side wall 53. The protrusion section 54A is disposed at an interval greater than a width of an arm section 77 (see FIG. 9) described below from the left side wall 52 in the W direction. The protrusion section 54B is disposed with respect to the right side wall 53 at an interval greater than a width of an arm section 78 (see FIG. 9) described below in the W direction. Then, the protrusion section 54A and the protrusion section 54B are disposed at an interval in the W direction.

The first back wall 55 is a plate-shaped portion extending from the left side wall 52 to the left side in the W direction (W-H surface) on the back side of the left side wall 52 in the D direction. Furthermore, the first back wall 55 is formed in a square shape viewed in a front view (viewed in the D direction).

The second back wall 56A is a portion having a plate shape extending from the left side wall 52 to the right side in the W direction (W-H surface) on the back side of the left side wall 52 in the D direction. Furthermore, a through hole 56C passing through in the D direction is formed in the second back wall 56A. The second back wall 56B is a plate-shaped portion extending from the right side wall 53 to the left side in the W direction (W-H surface) on the back side of the right side wall 53. Furthermore, the through hole 56C (see FIG. 3) is formed in the second back wall 56B.

The right front wall 57 is a plate-shaped portion extending from the right side wall 53 to the right side in the W direction (W-H surface) on the front side of the right side wall 53. Furthermore, the right front wall 57 is formed in a square shape viewed in a front view. Here, a screw (not illustrated) is fastened to the fastening hole 46B (see FIG. 3) through the through hole 56C and thereby the guide frame 50 is mounted on the body member 40 (see FIG. 3).

Lid Section

As illustrated in FIGS. 2 and 3, the lid section 60 has a rotation frame 62, a mounting frame 64, a packing 66, a holding member 68, an outer cover 72, and a spring material 74. The rotation frame 62 is an example of a fixing member. The mounting frame 64 is an example of a mounted member. The packing 66 is an example of a waterproof member. The holding member 68 is an example of a holding member. The outer cover 72 is an example of a cover member. The spring material 74 is an example of a biasing member.

Furthermore, the lid section 60 is provided with the coil spring 84, the torsion spring 88, a mounting member 92, and the lock member 90. The coil spring 84 is an example of a pressing member. The torsion springs 88 are an example of a first biasing section and a second biasing section. The lock member 90 is an example of a locking member.

Rotation Frame

Figure 7:
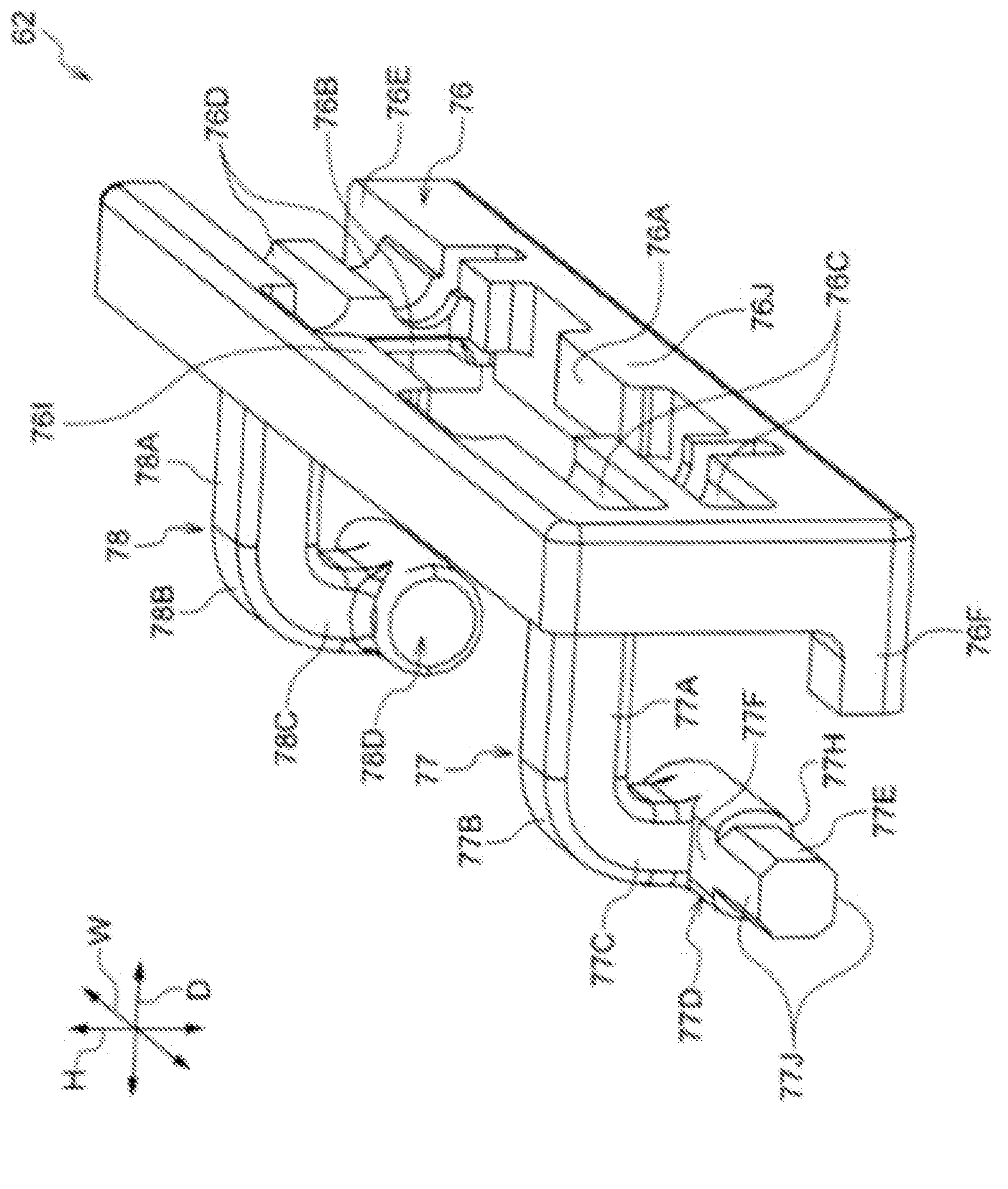
FIG. 7 is a perspective view of a rotation frame according to the embodiment.

As illustrated in FIG. 7, the rotation frame 62 includes a body section 76, and arm sections 77 and 78.

The body section 76 is formed in a rectangular plate shape in which the W direction is the longitudinal direction, the H direction is the lateral direction, and the D direction is the thickness direction. Furthermore, an accommodation section 76A, a through hole 76B, a recessed section 76C, a guide groove 76D, a hole section 76E, and a stopper section 76F are formed in the body section 76.

The accommodation section 76A is a portion recessed from the front side to the back side in the D direction and is formed from the center portion in the W direction and in the H direction to the right end in the W direction in the body section 76. That is, the accommodation section 76A is a recess in which the lower side, the left side, and the upper side are closed, and the right side is open viewed in a front view. Furthermore, inside wall surfaces in the up and down sides of the accommodation section 76A are parallel to each other in the W direction. Furthermore, an interval of the vertical inside wall surfaces of the accommodation section 76A is greater than a width of the holding member 68 (see FIG. 2) in the H direction. In addition, a depth of the accommodation section 76A in the D direction is greater than a thickness of the holding member 68 in the D direction. Thus, the holding member 68 is accommodated in the accommodation section 76A.

Furthermore, a convex section 76I protruding downward from the upper portion in the center in the W direction and a convex section 76J protruding upward from the lower portion in the center in the W direction are formed in the accommodation section 76A. Moreover, a lower surface of the convex section 76I and an upper surface of the convex section 76J are a part of the accommodation section 76A. That is, the lower surface of the convex section 76I and the upper surface of the convex section 76J guide the holding member 68 (see FIG. 2) described below in the W direction.

The through hole 76B passes through the body section 76 in the center portion in the H direction and in the W direction in the body section 76 and the back side of the accommodation section 76A in the D direction. The through hole 76B is formed in a rectangular shape in which the W direction is the longitudinal direction viewed in a front view. Furthermore, the through hole 76B has a size such that moving of a protrusion 68C (see FIG. 3) described below of the holding member 68 is not suppressed when the lock member 90 (see FIG. 2) described below is moved (slid) in the W direction using the holding member 68 (see FIG. 2).

The recessed section 76C is a portion recessed from the front side to the back side in the D direction on the left side of the accommodation section 76A in the W direction. Furthermore, as an example, the recessed section 76C is a concave groove in which a D-H cross section is cut in a circular shape and is formed in two portions (the same number as that of the number of the spring materials 74 (see FIG. 2) described below) at an interval in the H direction. Furthermore, in the recessed section 76C, the left side in the W direction is closed and the right side communicates with the accommodation section 76A. In addition, two recessed sections 76C have sizes so as to respectively accommodate half of the spring materials 74 (see FIG. 2) in a circumferential direction.

The guide groove 76D is a portion recessed from the front side to the rear side in the D direction on the right back side of the accommodation section 76A. Furthermore, as an example, the guide groove 76D is a concave groove in which the D-H cross section is cut in a semi-circular shape and is formed in two portions at an interval in the H direction. Furthermore, the guide groove 76D is configured such that the left side and the front side communicate with the accommodation section 76A and the right side communicates with the hole section 76E. In addition, two guide grooves 76D have sizes so as to accommodate a part of guided sections 68D (see FIG. 3) of the holding member 68 in the circumferential direction.

The hole section 76E is formed on the right back side of the accommodation section 76A and the right side of the guide groove 76D in the W direction. Furthermore, the hole section 76E is a portion in which the front side in the D direction communicates with the accommodation section 76A, the right side in the W direction communicate with the guide groove 76D, and the right side in the W direction and the back side in the D direction are open. Furthermore, the hole section 76E has a size so as to accommodate a bending section 68B (see FIG. 14) of the holding member 68 described below.

The stopper section 76F is formed in a rear surface 76G (see FIG. 3) that is the side surface of the body section 76 on the back side in the D direction. Specifically, the stopper section 76F is a prismatic portion protruding from the lower end to the back side in the H direction on both ends of the rear surface 76G in the W direction. Furthermore, an end surface of the stopper section 76F on the back side is formed in a plane shape along the W-H surface. Then, when the rotation frame 62 is rotated in a direction in which the opening 44A (see FIG. 2) is opened, the stopper section 76F comes into contact with the lower surface of the housing 12 (see FIG. 1) and suppresses excessive rotation of the rotation frame 62.

As illustrated in FIG. 3, protrusions 76H protruding to the center are formed in the upper portion and the lower portion of the center in the W direction further toward back side than the through hole 76B in the rotation frame 62. The protrusions 76H suppress the mounting frame 64 from being removed from the rotation frame 62 by coming into contact with the upper portion and the lower portion of the center of the mounting frame 64 in the W direction. Thus, the mounting frame 64 is fixed to the rotation frame 62.

As illustrated in FIG. 7, the arm section 77 has a first arm section 77A, a bending section 77B, a second arm section 77C, a shaft section 77D, and a mounted section 77E. The first arm section 77A extends in a prismatic shape from a portion of the left side of the through hole 76B in the W direction to the back side in the D direction on the back side of the body section 76 in the D direction. The bending section 77B is bent to the lower side in the H direction continuing to the end portion of the first arm section 77A on the rear side in the D direction. The second arm section 77C extends in a prismatic shape to the lower side in the H direction continuing to the lower end of the bending section 77B.

Figure 8:
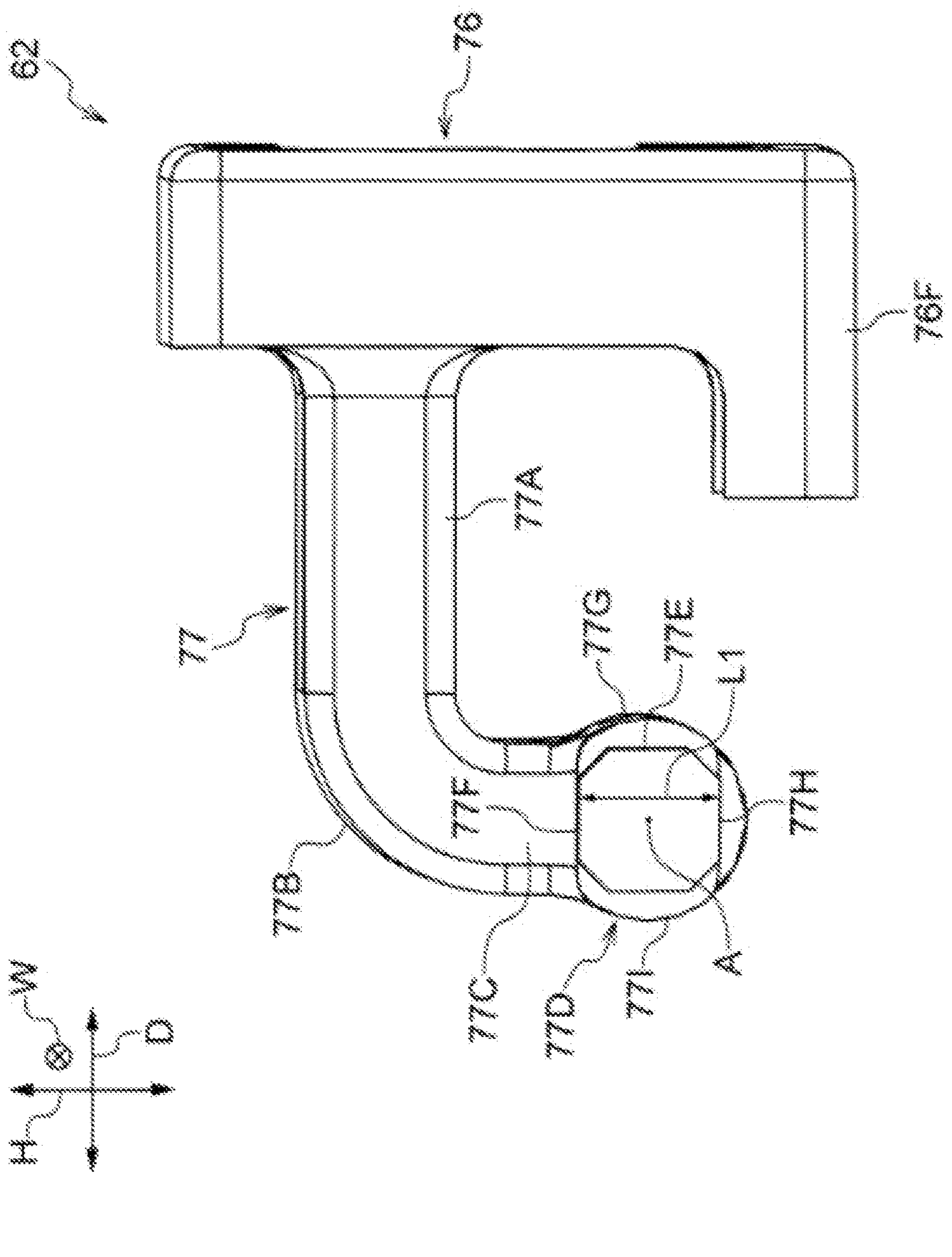
FIG. 8 is a left side view of the rotation frame according to the embodiment.

The shaft section 77D extends from the lower end of the second arm section 77C to the left side in the W direction. Furthermore, as illustrated in FIG. 8, a shape of the shaft section 77D is a shape obtained by removing two D-shaped portions symmetrical about a point A from a circle centered on the point A viewed in the W direction. Specifically, the shaft section 77D has a plane 77F, a curved surface 77G, a plane 77H, and a curved surface 771 viewed from the W direction. The plane 77F and the plane 77H are parallel to each other. The curved surface 77G and the curved surface 771 are peripheral surfaces corresponding to an outer periphery of a circle around the point A.

A distance L1 from the plane 77F to the plane 77H is shorter than the width L2 (see FIG. 6) of the long hole portion 58B (see FIG. 6) in the H direction and is a distance over which the plane 77F and the plane 77H are guided by the long hole portion 58B. Furthermore, a diameter of a circle in which the curved surface 77G and the curved surface 77I are the outer periphery thereof is smaller than a diameter of the circular hole portion 58A (see FIG. 6) and has a size in which the curved surface 77G and the curved surface 77I are guided by the circular hole portion 58A in the circumferential direction.

As an example, in the mounted section 77E, the W direction is the axial direction and the D-H surface is formed in an octagonal prismatic shape. Furthermore, in the mounted section 77E, a set of facing surfaces 77J (see FIG. 7) are on the same surface as the plane 77F and the plane 77H.

As illustrated in FIG. 7, the arm section 78 has a first arm section 78A, a bending section 78B, a second arm section 78C, and a shaft section 78D. The first arm section 78A extends in a prismatic shape from a portion of the right side of the through hole 76B to the back side in the D direction on the back side of the body section 76 in the D direction. The bending section 78B is bent downward in the H direction continuously to the end portion of the first arm section 78A on the back side in the D direction. A second arm section 78C extends downward in a prismatic shape in the H direction continuously to the lower end of the bending section 78B.

Figure 10:
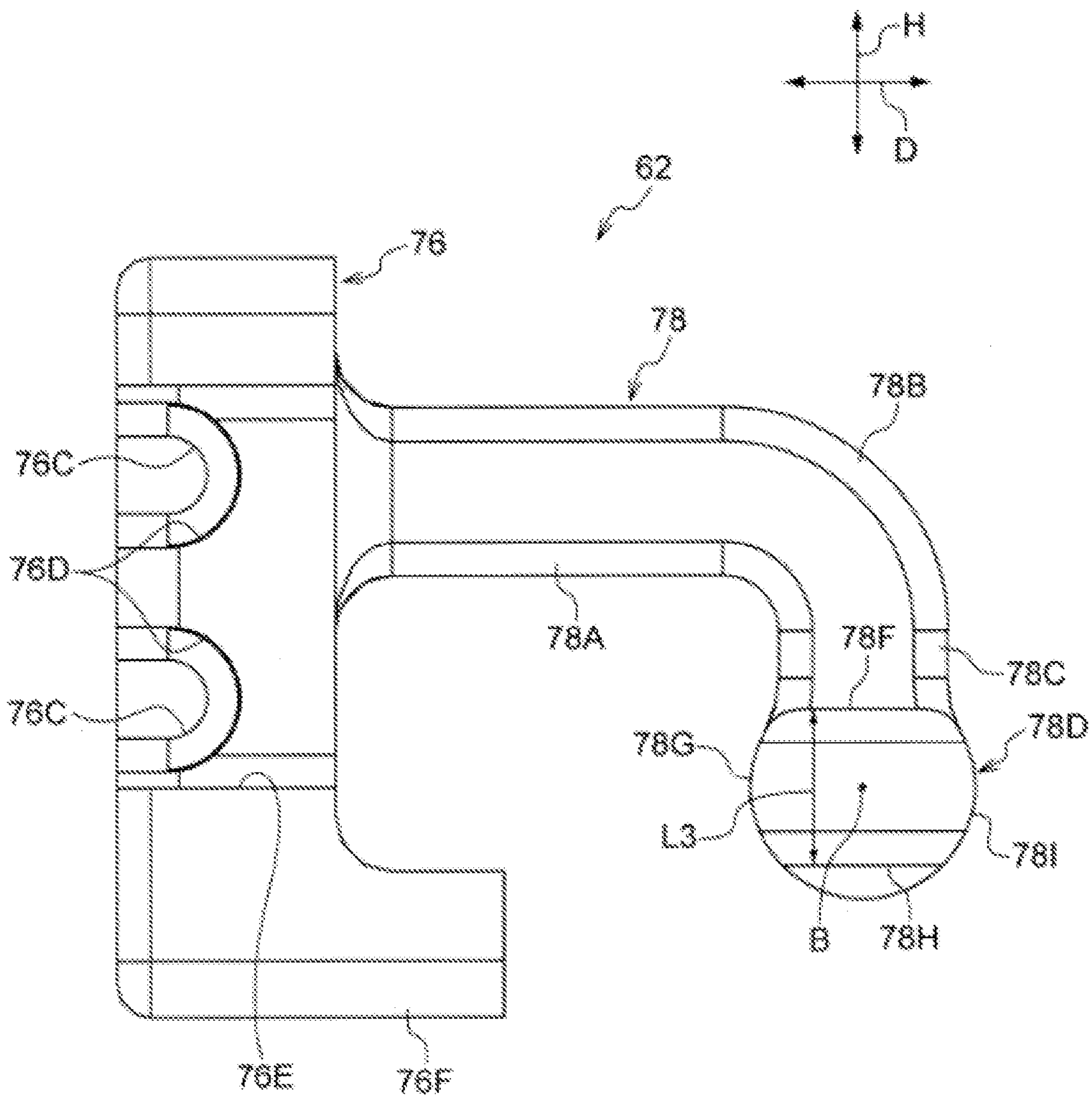
FIG. 10 is a right side view of the rotation frame according to the embodiment.

The shaft section 78D extends to the right side from the lower end of the second arm section 78C in the W direction. Furthermore, as illustrated in FIG. 10, the shape of the shaft section 78D is a shape that is formed by removing two D-shaped portions symmetrical about a point B from a circle centered on the point B viewed in the W direction. Specifically, the shaft section 78D has a plane 78F, a curved surface 78G, a plane 78H, and a curved surface 78I in the W direction. The plane 78F and the plane 78H are parallel to each other. The curved surface 78G and the curved surface 78I are peripheral surfaces corresponding to an outer periphery of a circle around the point B.

A distance L3 from the plane 78F to the plane 78H is shorter than the width L2 (see FIG. 6) of the long hole portion 58B (see FIG. 6) in the H direction and is a distance over which the plane 78F and the plane 78H are guided by the long hole portion 58B. Furthermore, a diameter of a circle in which the curved surface 78G and the curved surface 78I are the outer periphery thereof is smaller than the diameter of the circular hole portion 58A (see FIG. 6) and has a size in which the curved surface 78G and the curved surface 78I are guided in the circumferential direction by the circular hole portion 58A.

Figure 9:
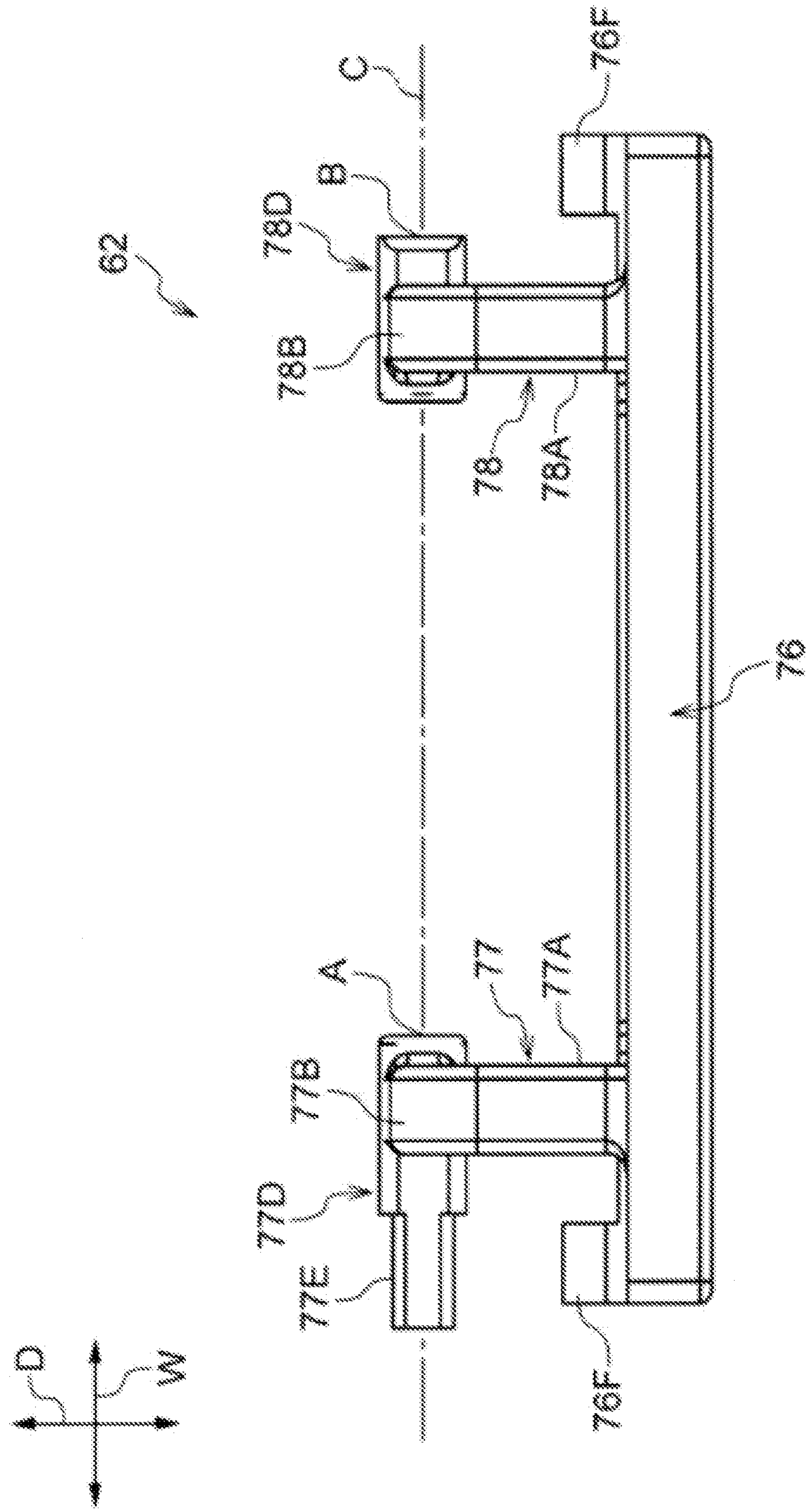
FIG. 9 is a plan view of the rotation frame according to the embodiment.

Here, as illustrated in FIG. 9, the point A (see FIG. 8) that is the rotation center of the shaft section 77D and the point B that is the rotation center of the shaft section 78D are positioned on a straight line C in the W direction. That is, the shaft section 77D and the shaft section 78D are rotated about the straight line C as the axis thereof.

Mounting Plate

Figure 11:
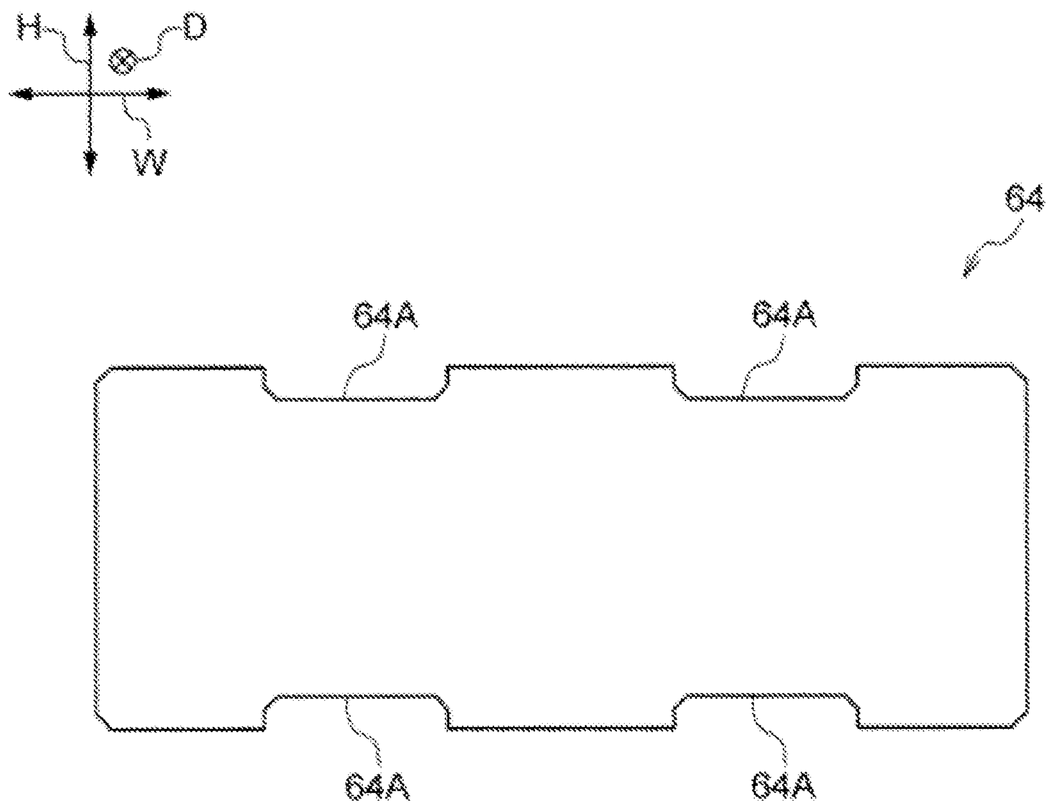
FIG. 11 is a front view of a mounting plate according to the embodiment.

As illustrated in FIG. 11, the mounting frame 64 is formed in a rectangular shape in which the W direction is the longitudinal direction, the H direction is the lateral direction, and the D direction is the thickness direction of the plate viewed from a front view. Furthermore, as an example, in the mounting frame 64, four cutout sections 64A are formed on the upper side and the lower side in the H direction at an interval in the W direction. Furthermore, a side of the mounting frame 64 in the W-H surface has a size in which the packing 66 (see FIG. 12) described below is fitted on the inside of the mounting frame 64 viewed in a front view.

A depth of the cutout section 64A in the H direction is greater than a thickness of a claw section 93 (see FIG. 17) of the lock member 90 described below in the H direction. Furthermore, a width of the cutout section 64A in the W direction is wider than a width of an extension section 93A (see FIG. 17) of the claw section 93 described below. Thus, the claw section 93 may move inside the cutout section 64A in the W direction.

Packing

Figure 12:
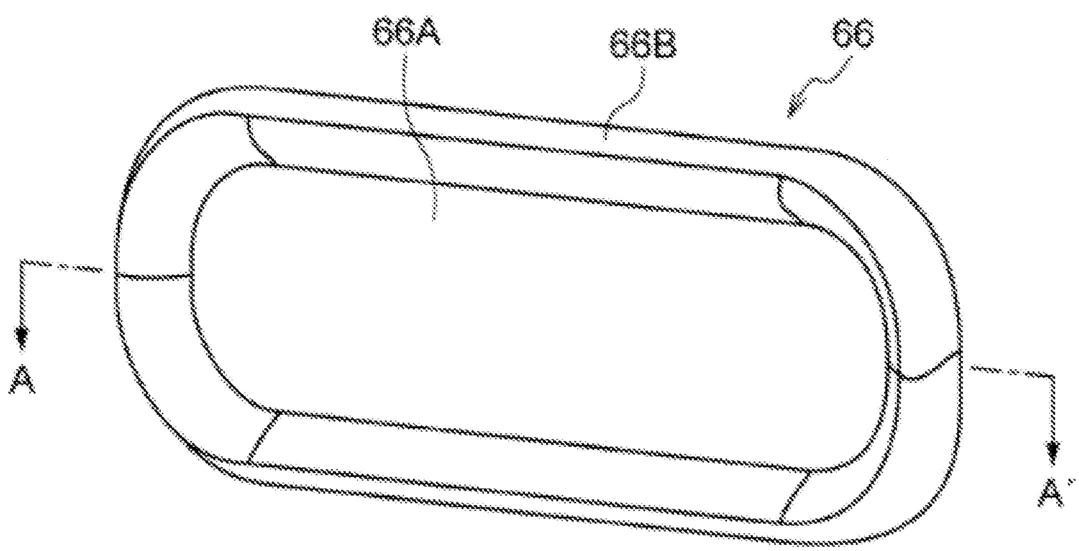
FIG. 12 is a perspective view of a packing according to the embodiment.

As an example, the packing 66 illustrated in FIG. 12 is formed of silicon rubber. Furthermore, the packing 66 has a plate-shaped fixing section 66A fixed to the mounting frame 64 (see FIG. 11) and a peripheral edge section 66B formed in a peripheral edge of the fixing section 66A. The fixing section 66A and the peripheral edge section 66B are integrally formed. As an example, the fixing section 66A is fixed to the mounting frame 64 by two-color molding. Moreover, a fixing method of the fixing section 66A to the mounting frame 64 is provided by integral molding or using an adhesive.

Figure 13:
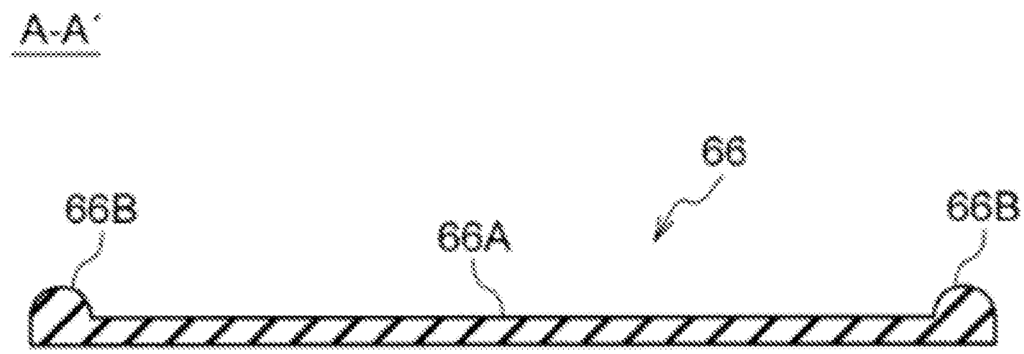
FIG. 13 is a cross-sectional view (cross section along line A-A' of FIG. 12) of the packing according to the embodiment.

As illustrated in FIG. 13, the peripheral edge section 66B of the packing 66 protrudes from the fixing section 66A. A protruding length from the fixing section 66A of the peripheral edge section 66B is a length in which the peripheral edge section 66B is compressed by being sandwiched between the first front wall 44 (see FIG. 5) and the mounting frame 64 (see FIG. 11) when the packing 66 is disposed in a closed position described below. Furthermore, the peripheral edge section 66B is formed in a closed curve shape so as to surround the opening 44A (see FIG. 5) viewed in a front view (viewed in the D direction) in a closed state in which the packing 66 is disposed in the closed position.

Holding Member

Figure 14:
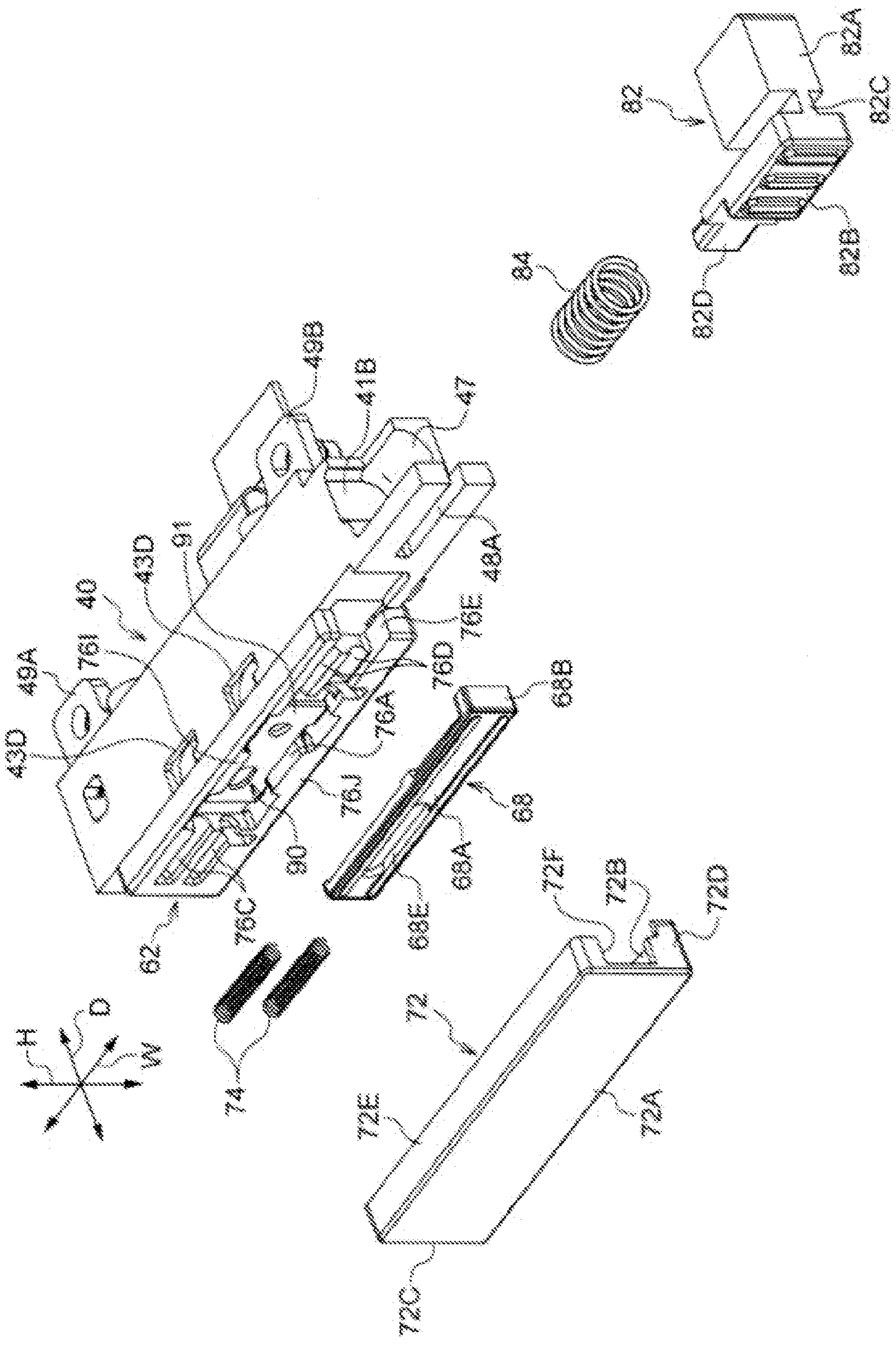
FIG. 14 is a partial exploded perspective view of the lid section according to the embodiment.

As illustrated in FIG. 14, the holding member 68 has a body section 68A having a rectangular plate shape in which the W direction is the longitudinal direction, the H direction is the lateral direction, and the D direction is the thickness direction. The bending section 68B bent toward the body member 40 (back side in the D direction) is formed in a right end portion of the body section 68A in the W direction. Furthermore, a concave section 68E is formed on a left side of the center in the W direction on the front side of the body section 68A in the D direction. The concave section 68E is open on the front side and a convex section 72G (see FIG. 3) of the outer cover 72 described below may be inserted thereinto. Furthermore, as illustrated in FIG. 3, the protrusion 68C is formed on the left side (right side in the drawing) and the guided section 68D is formed on the right side (left side in the drawing) in a rear surface (surface on the back side) of the body section 68A.

As an example, the protrusion 68C is a cylindrical portion protruding backward from the body section 68A in which in the D direction is the axial direction. Furthermore, as an example, the protrusion 68C is formed in two portions at an interval in the W direction. As an example, the guided section 68D is a semi-cylindrical portion protruding backward from the body section 68A in which the W direction is the axial direction. Furthermore, as an example, the guided section 68D is formed in two portions at an interval in the H direction. Moreover, the lock member 90 described below is mounted on the protrusion 68C. Furthermore, the guided section 68D is guided by the guide groove 76D (see FIG. 7).

Outer Cover

As illustrated in FIG. 14, the outer cover 72 has a rectangular-shaped front wall 72A in which the W direction is the longitudinal direction, the H direction is the lateral direction, and the D direction is the thickness direction. Furthermore, the outer cover 72 has a bottom wall 72B extending backward from the lower end of the front wall 72A in the D direction and an upper wall 72E extending backward from the upper end of the front wall 72A in the D direction. Furthermore, the outer cover 72 has a left side wall 72C extending backward from the left end of the front wall 72A in the D direction and a right side wall 72D extending backward from the right end of the front wall 72A in the D direction.

A cutout 72F that is open on the back side in the D direction is formed in the right side wall 72D. Moreover, the rotation frame 62 is mounted (accommodated) inside a space surrounded by the front wall 72A, the bottom wall 72B, the left side wall 72C, the right side wall 72D, and the upper wall 72E in the outer cover 72. Furthermore, as illustrated in FIG. 3, the convex section 72G protruding on the back side is formed on the back side of the front wall 72A. The convex section 72G extends in the W direction and has a size so as to be inserted into the concave section 68E (see FIG. 14) of the holding member 68.

Spring Material

As an example, as illustrated in FIG. 14, the spring material 74 is a coil spring having a diameter smaller than that of the coil spring 84 described below. Furthermore, two spring materials 74 are provided and are respectively accommodated in the recessed section 76C in which the W direction is a biasing direction.

Lock Knob

As illustrated in FIG. 14, as an example, the lock knob 82 has a biased section 82A, an operation section 82B, and the connection section 82C. The biased section 82A is formed in a rectangular parallelepiped shape. The operation section 82B is formed in a rectangular shape in which the W direction is the longitudinal direction, the H direction is the lateral direction, and the D direction is the thickness direction. The connection section 82C connects the front side of the biased section 82A and the back side of the operation section 82B. Furthermore, the connection section 82C is a plate-shaped portion along the W-D surface. Furthermore, a thickness of the connection section 82C in the H direction has a size so as to be inserted into the groove 48A. In addition, a contact section 82D coming into contact with the bending section 68B of the holding member 68 is formed in the left end of the operation section 82B.

Coil Spring

As illustrated in FIG. 14, the coil spring 84 has a size so as to be arranged in the spring arrangement section 47 of the body member 40. Furthermore, the coil spring 84 is sandwiched between the right side wall 41B of the body member 40 and the biased section 82A of the lock knob 82 in a state of being arranged in the spring arrangement section 47.

Torsion Spring

Figure 15:
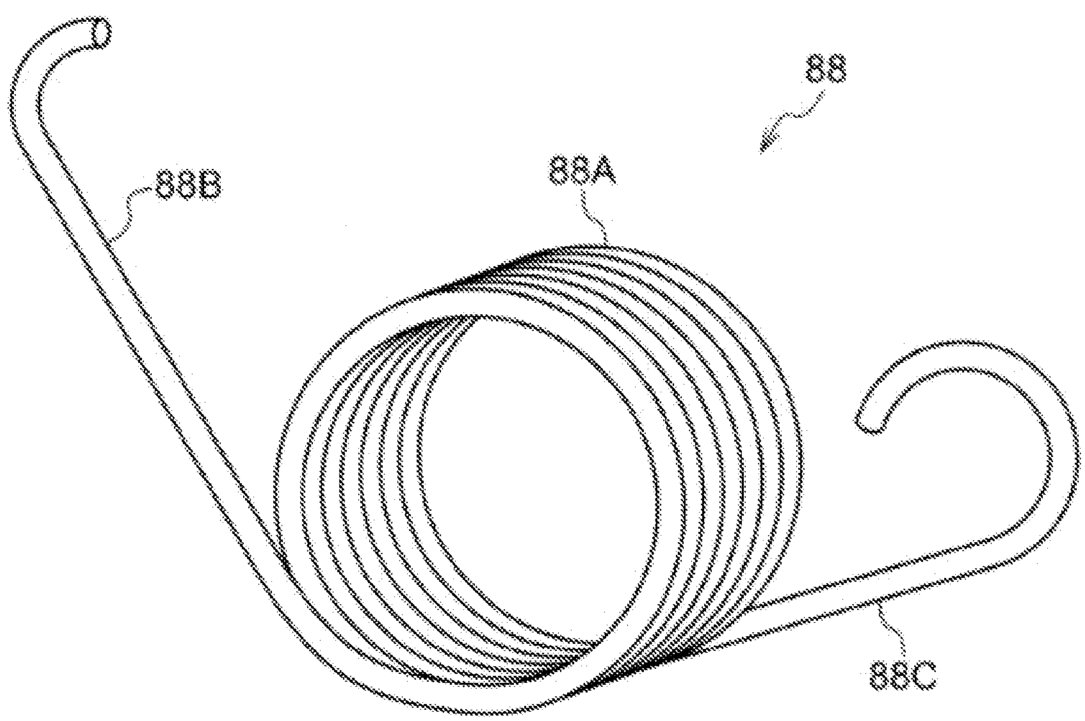
FIG. 15 is a perspective view of a torsion spring according to the embodiment.

As illustrated in FIG. 15, the torsion spring 88 has an annular section 88A that is spirally wound, a first spring section 88B that protrudes on one side from the annular section 88A, and a second spring section 88C that protrudes on the other side from the annular section 88A. The annular section 88A has a size so as to allow insertion of a cylindrical section 92D (see FIG. 16) of the mounting member 92 described below. The first spring section 88B is an example of a first biasing section. A leading end of the first spring section 88B is bent in an arc shape. The second spring section 88C is an example of a second biasing section. A leading end of the second spring section 88C is bent in an arc shape.

Mounting Member

Figure 16:
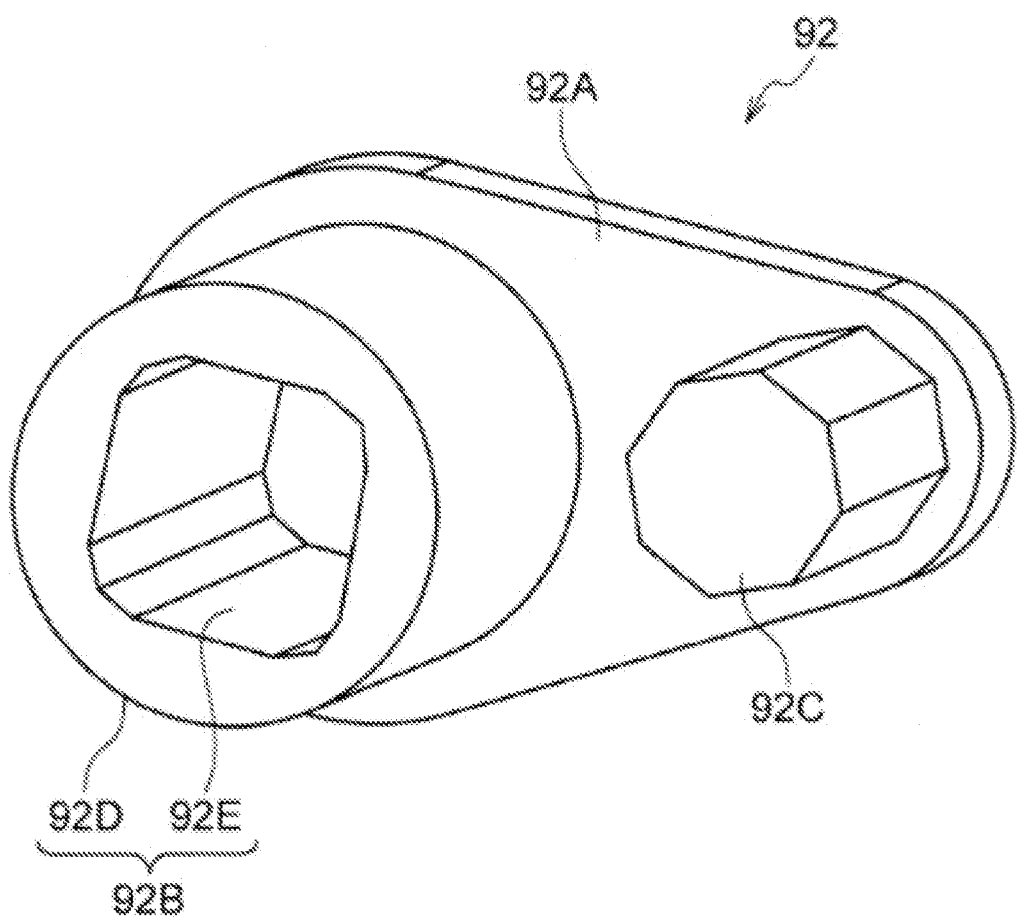
FIG. 16 is a perspective view of a mounting member according to the embodiment.

As illustrated in FIG. 16, as an example, the mounting member 92 has a plate section 92A, a fitting section 92B, and a protrusion section 92C. As an example, the plate section 92A has an outer shape in which a circle having a large diameter and a circle having a small diameter are connected by a common tangent. Furthermore, the plate section 92A is disposed along the left side wall 52 (see FIG. 6). The fitting section 92B has the cylindrical section 92D that protrudes from the plate section 92A and a fitting hole 92E that passes through the plate section 92A and the cylindrical section 92D.

As described above, the cylindrical section 92D has a size so as to be inserted into the annular section 88A (see FIG. 15) of the torsion spring 88. The fitting hole 92E has a size such that the mounted section 77E (see FIG. 7) of the shaft section 77D fits. As an example, the protrusion section 92C is formed in an octagonal cylindrical shape and protrudes from the plate section 92A in the same direction as the cylindrical section 92D. Furthermore, the protrusion section 92C has a size such that a leading end portion of the second spring section 88C (see FIG. 15) is hooked.

Lock Member

Figure 17:
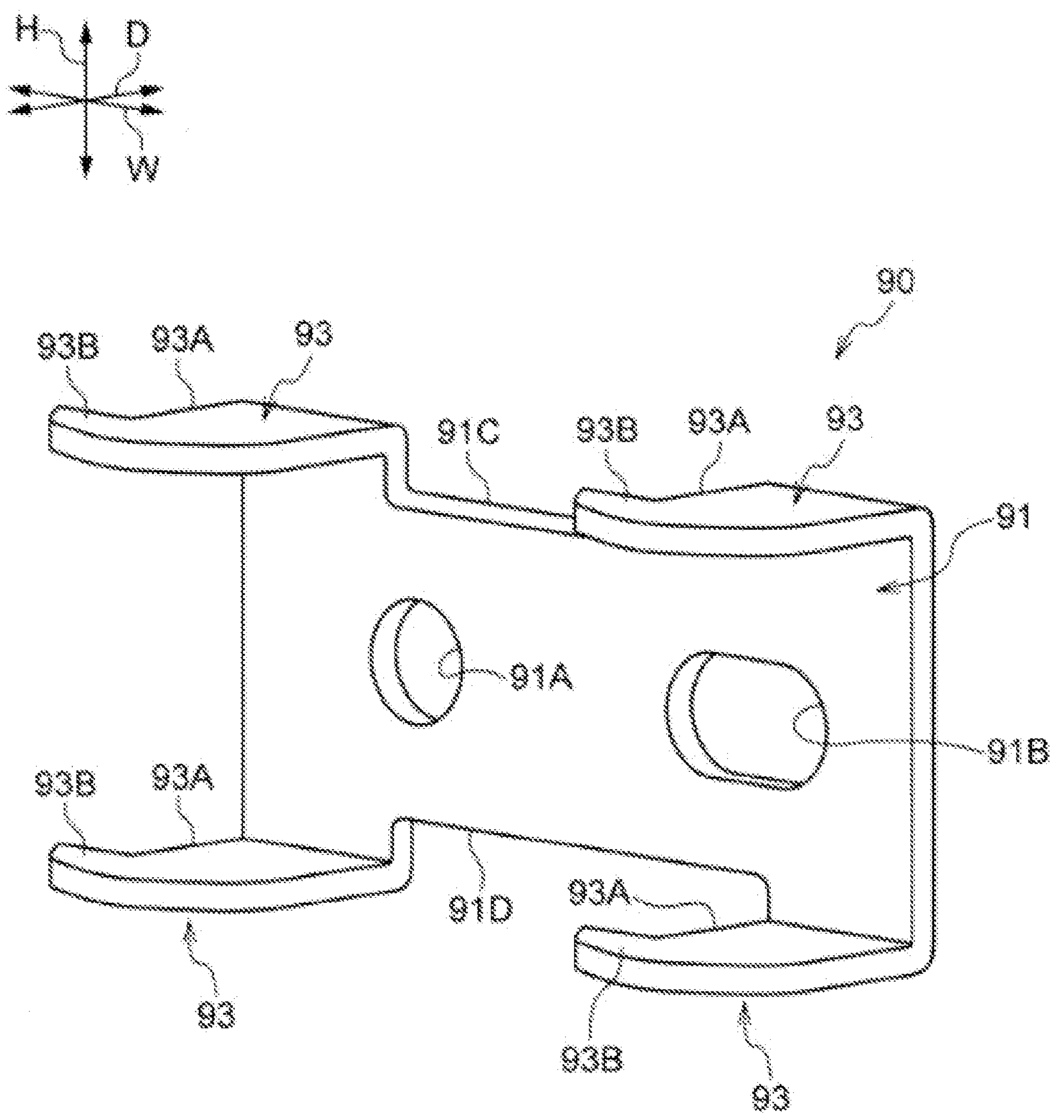
FIG. 17 is a perspective view of a lock member according to the embodiment.

As illustrated in FIG. 17, the lock member 90 has a slide plate 91 and four claw sections 93 that protrude from the slide plate 91 in the D direction.

The slide plate 91 is formed in a rectangular plate shape in which the W direction is the longitudinal direction, the H direction is the lateral direction, and the D direction is the thickness direction. Furthermore, a through hole 91A and a through hole 91B are formed at an interval in the W direction in the center in the H direction, in the slide plate 91. The through hole 91A is a circular hole and is passed therethrough in the D direction. The through hole 91B is a long hole in the W direction and is passed therethrough in the D direction. Furthermore, cutouts 91C and 91D are formed on the upper side and on the lower side in the center in the W direction in the slide plate 91.

The claw section 93 is an example of a claw body. Furthermore, the claw section 93 is formed in two portions in the upper end (both outside of the cutout 91C in the W direction) and in two portions in the lower end (both outside of the cutout 91D in the W direction) of the slide plate 91 by bending a part of the slide plate 91. Furthermore, as an example, the claw section 93 has the extension section 93A extending to the back side from the slide plate 91 in the D direction and a locking section 93B protruding from the rear end (end portion on the back side) of the extension section 93A on the right side in the W direction. Moreover, the locking section 93B is formed such that a side surface is a curved surface. Thus, when the locking section 93B moves in the D direction and comes into contact with the end portion of the locked section 43D (see FIG. 5) in the W direction, the locking section 93B moves in the W direction.

Assembly of Lid Open-Close Section

Next, an example of a procedure of assembling of the lid open-close section 30 will be described.

In the assembly of the lid open-close section 30 illustrated in FIG. 3, the holding member 68 is accommodated in the accommodation section 76A (see FIG. 7) of the rotation frame 62. Then, the lock member 90 is disposed on the back side of the rotation frame 62 in the D direction and the protrusion 68C of the holding member 68 is fitted into the through holes 91A and 91B of the lock member 90 and thereby the lock member 90 is mounted on the holding member 68.

Subsequently, the mounting frame 64 is disposed on the back side of the lock member 90 in the D direction. Then, the mounting frame 64 is locked to the protrusion 76H and is mounted on the rotation frame 62, and thereby the slide plate 91 is disposed between the rotation frame 62 and the mounting frame 64. The slide plate 91 has a degree of freedom of movement in the W direction. Then, the slide plate 91 is relatively moved with respect to the rotation frame 62 in the W direction (slidably held by the rotation frame 62). Moreover, the packing 66 and the mounting frame 64 are integrally formed as described above.

Subsequently, the spring material 74 is inserted into the recessed section 76C (see FIG. 7) of the rotation frame 62. An elastic force of the spring material 74 acts on the left side surface and thereby the holding member 68 is biased to the right side. Then, in a state where the convex section 72G of the outer cover 72 is inserted into the concave section 68E (see FIG. 14) of the holding member 68, the outer cover 72 is mounted on the rotation frame 62. At this time, the bending section 68B (see FIG. 14) of the holding member 68 is disposed inside the cutout 72F (see FIG. 14) of the outer cover 72. As described above, the lid section 60 is assembled.

Figure 18:
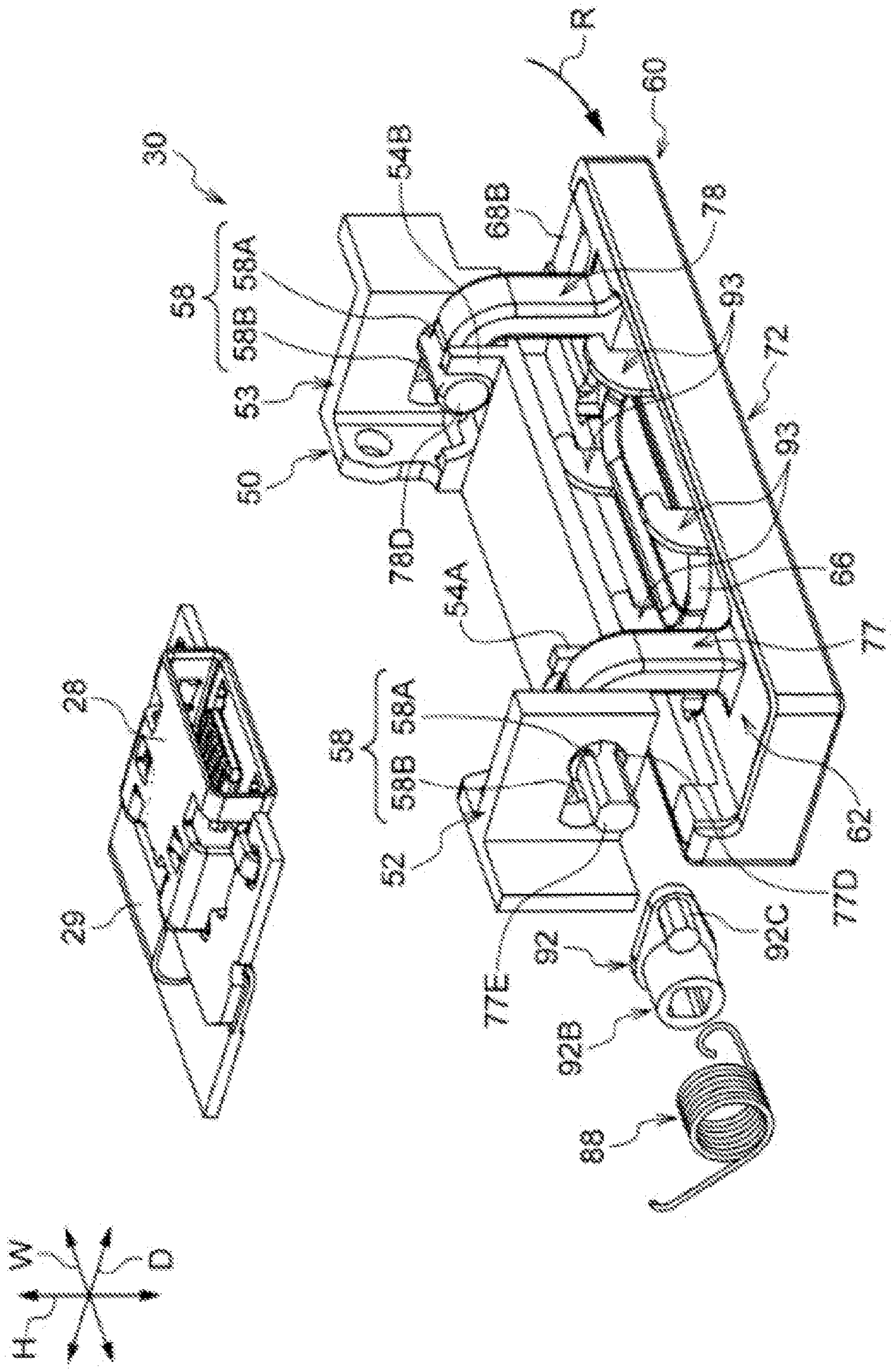
FIG. 18 is a partial exploded perspective view illustrating a state where a base material and the torsion spring are mounted on a shaft section according to the embodiment.

Subsequently, as illustrated in FIG. 18, the shaft sections 77D and 78D are inserted into two circular hole portions 58A of the guide frame 50. At this time, the shaft sections 77D and 78D rotate in an arrow R direction due to a weight of the lid section 60. The arrow R direction is a rotation direction and is a clockwise direction when viewed from the left side of the shaft section 77D in the W direction. In the following description, the rotation direction is referred to as an R direction. Thus, the plane 77F, the plane 77H, the plane 78F, and the plane 78H (see FIGS. 8 and 10) are upright along the H-W surface. Moreover, the arm section 77 is sandwiched between the left side wall 52 and the protrusion section 54A and the arm section 78 is sandwiched between the right side wall 53 and the protrusion section 54B, and thereby deviation of the lid section 60 in the W direction is reduced. Subsequently, the fitting section 92B of the mounting member 92 is fitted into the mounted section 77E.

Figure 19:
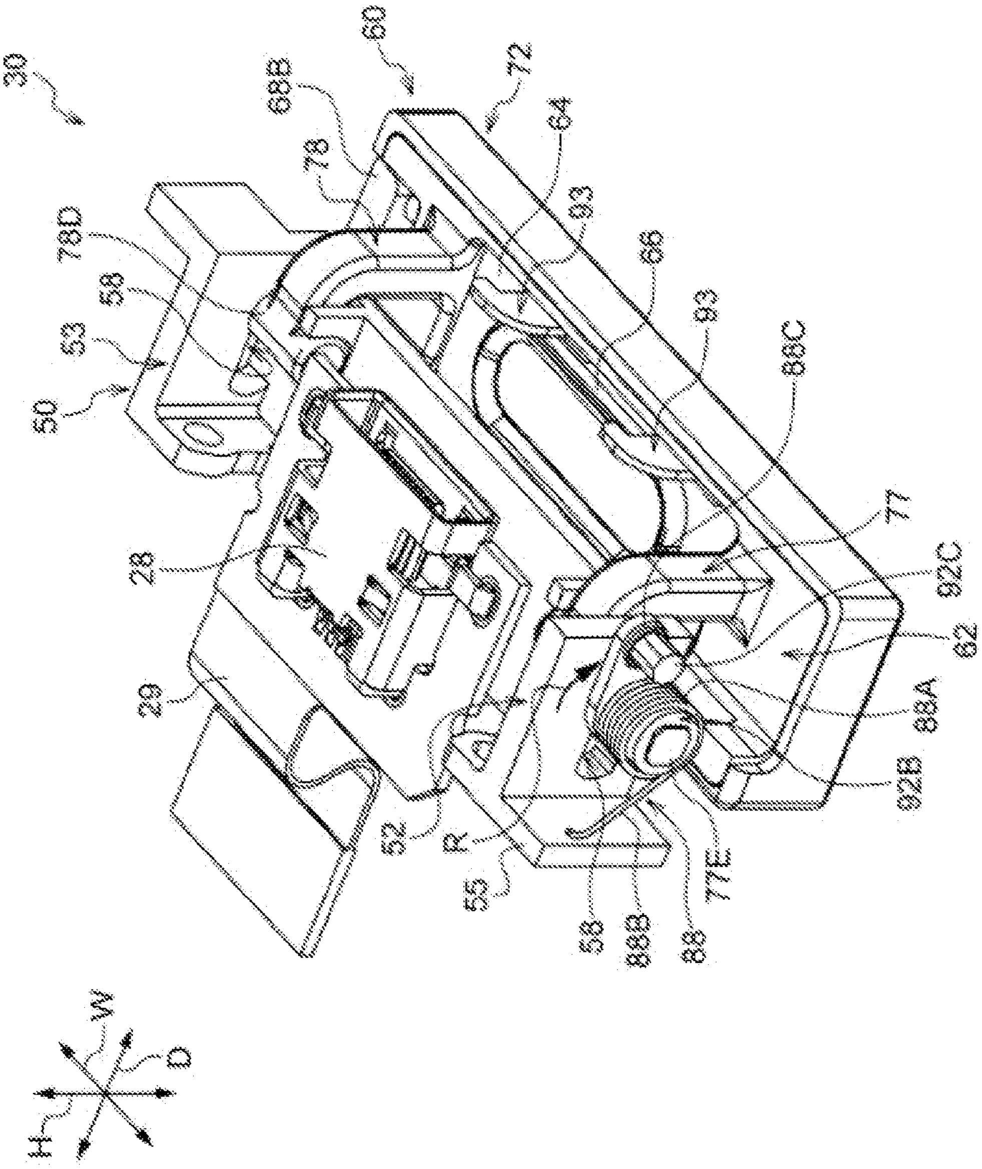
FIG. 19 is a partial perspective view illustrating an open state of the lid section according to the embodiment.

Subsequently, as illustrated in FIG. 19, the fitting section 92B is inserted into the annular section 88A of the torsion spring 88. Then, a leading end of the first spring section 88B comes into contact with the front side of the first back wall 55 in the D direction and a leading end of the second spring section 88C is mounted on the protrusion section 92C. Thus, the torsion spring 88 is mounted on the shaft section 77D (see FIG. 18) and the mounted section 77E.

Here, the first spring section 88B of the torsion spring 88 receives a reaction force from the first back wall 55 and thereby the shaft section 77D (see FIG. 18) is biased to the front side in the D direction. Furthermore, the second spring section 88C of the torsion spring 88 biases the shaft section 77D in the R direction (see FIG. 18) in upright states described below of the rotation frame 62 and the outer cover 72.

Subsequently, the left side wall 52 is inserted into the second chamber section 42B (see FIG. 5) of the body member 40 and the right side wall 53 is inserted into the third chamber section 42C (see FIG. 5) of the body member 40. Then, the guide frame 50 is mounted on the body member 40 (see FIG. 5) by a spring (not illustrated). Subsequently, the jack 28 is inserted into the first chamber section 42A (see FIG. 5) of the body member 40 from the back side and is mounted on the body member 40 by engaging of an engaging section (not illustrated). Thus, the front side of the jack 28 is exposed to the opening 44A (see FIG. 5) of the body member 40. Moreover, in FIG. 19, illustration of the body member 40 is omitted to indicate an arrangement of the jack 28.

Subsequently, in a state where the connection section 82C of the lock knob 82 illustrated in FIG. 4 is inserted into the groove 48A of the body member 40, the body member 40 is fixed inside the first concave section 15 of the housing 12 by a spring (not illustrated). Thus, the lock knob 82 is accommodated inside the second concave section 16 and the operation section 82B is exposed on the front side from the window section 18 of the housing 12. Moreover, in FIG. 4, a state where the holding member 68 and the outer cover 72 are removed from the rotation frame 62 is illustrated, but practically, the holding member 68 and the outer cover 72 are mounted.

Furthermore, the contact section 82D of the lock knob 82 is disposed on the back side of the side wall 17 and is disposed close to the bending section 68B of the holding member 68. Here, the coil spring 84 is disposed in the spring arrangement section 47 of the body member 40 and is sandwiched between the right side wall 41B and the biased section 82A, and thereby the lock knob 82 is biased to the right side. Then, the touch panel 14 is mounted on the upper surface of the housing 12 by covering the lid open-close section 30 and thereby the smartphone 10 is formed.

Next, an operation and an effect of the embodiment will be described.

Closing Operation of Opening

Figure 29:
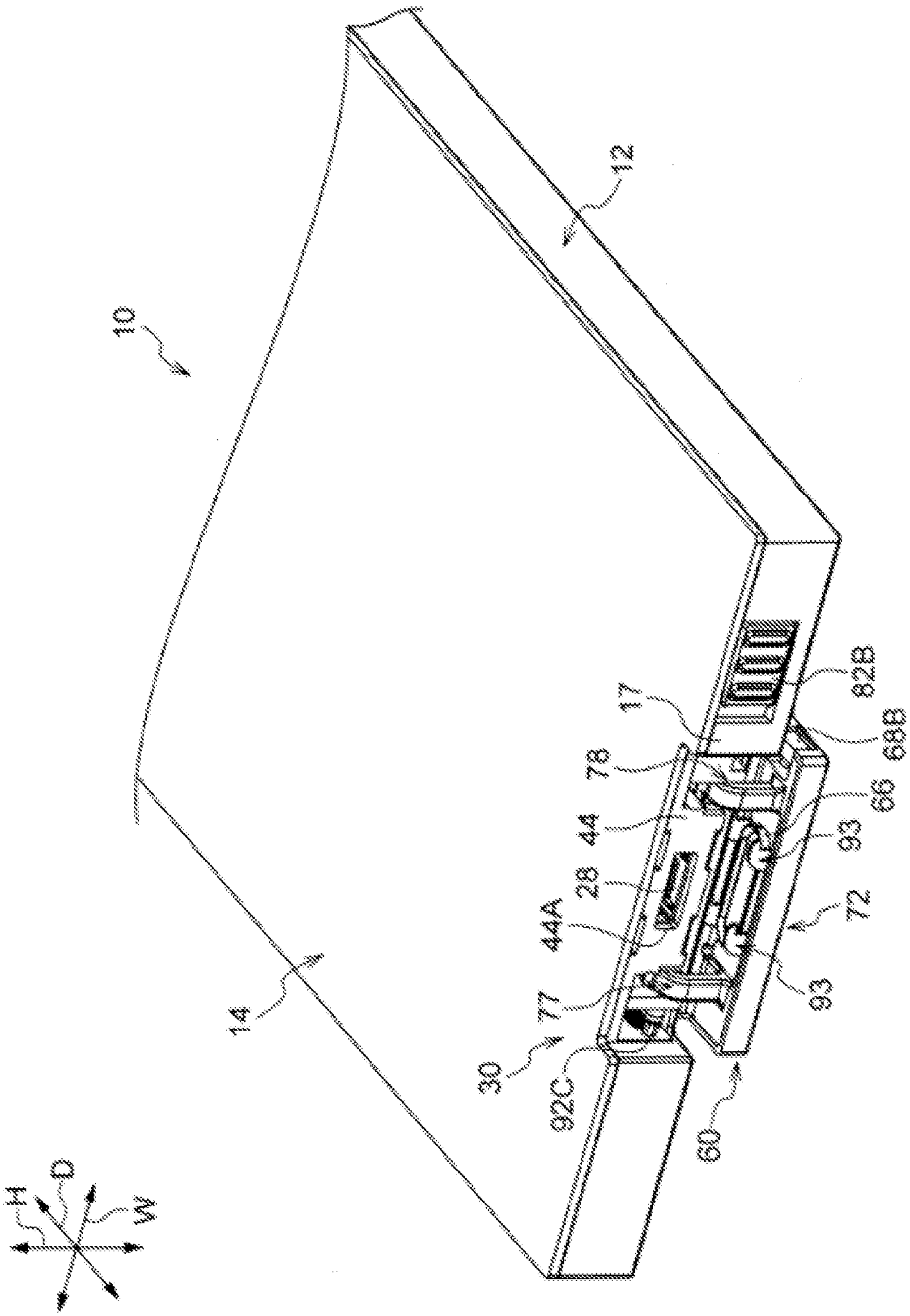
FIG. 29 is a partial perspective view illustrating the open state of the lid section according to the embodiment.

As illustrated in FIG. 29, a closing operation will be described when the lid section 60 is disposed below the housing 12 in the H direction and the opening 44A is closed by the lid section 60 (the packing 66) from an open state in which the opening 44A is open.

Figure 20:
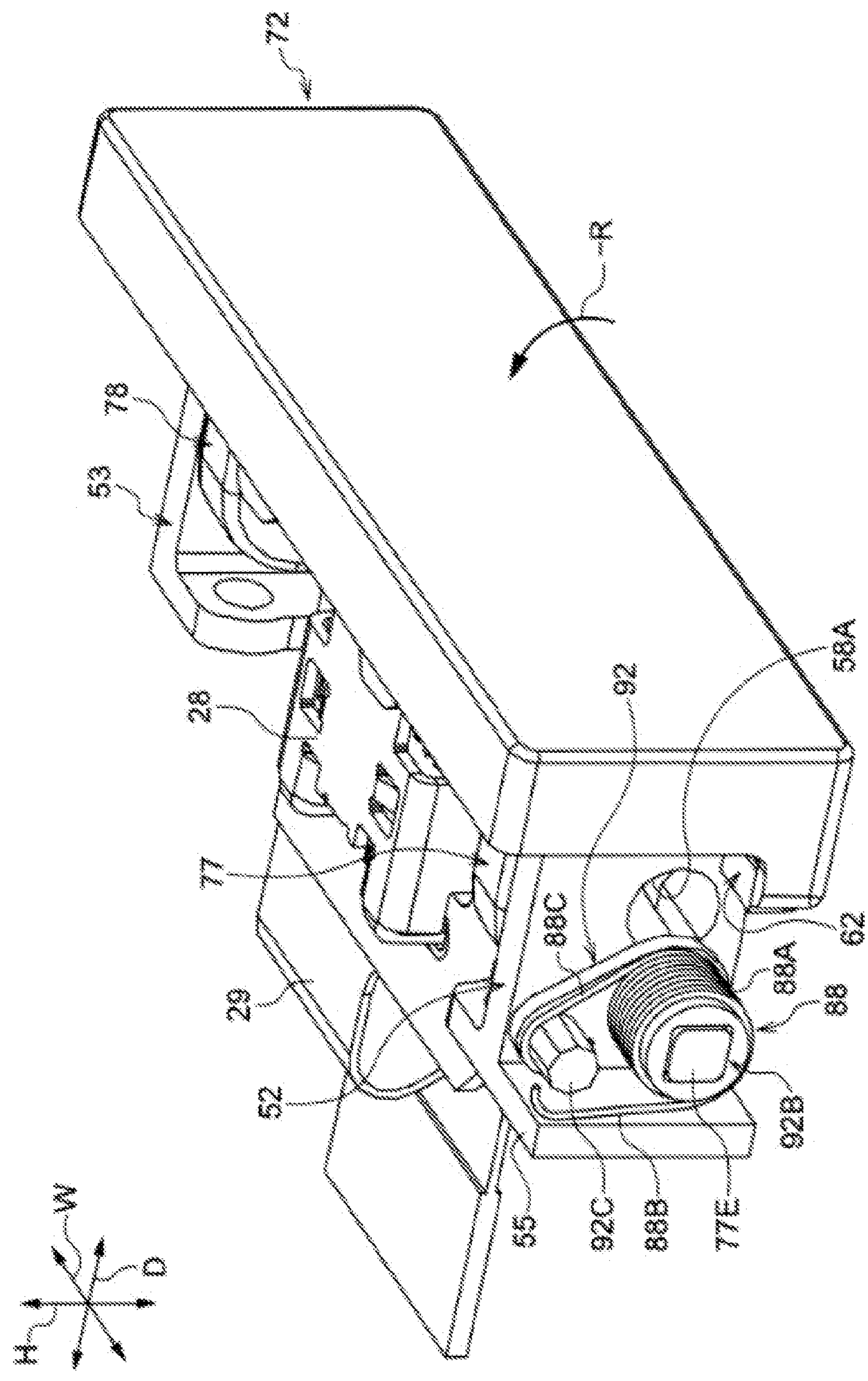
FIG. 20 is a partial perspective view illustrating a closed state of the lid section according to the embodiment.

The rotation frame 62 and the outer cover 72 are rotated in the −R direction as illustrated in FIG. 20 and thereby the shaft section 77D and the shaft section 78D illustrated in FIG. 18 are rotated inside the circular hole portion 58A against a biasing force of the torsion spring 88. Moreover, the −R direction is a counterclockwise direction when the shaft section 77D is viewed from the left side in the W direction. Then, a height of the inside wall surface of the long hole portion 58B (see FIG. 6) on the upper side in the H direction and heights of the plane 77F and the plane 78F (see FIGS. 8 and 10) are aligned, and a height of the inside wall surface of the long hole portion 58B on the lower side in the H direction and the heights of the plane 77H and the plane 78H (see FIGS. 8 and 10) are aligned.

Furthermore, when the rotation frame 62 and the outer cover 72 are rotated in the −R direction, the locking section 93B (see FIG. 17) of the claw section 93 comes into contact with the end portion in the D direction on the left side of the locked section 43D (see FIG. 5) in the W direction. Thus, the locking section 93B is not locked to the locked section 43D.

Subsequently, when the rotation frame 62 and the outer cover 72 are moved to the back side in the D direction while being against the biasing force of the torsion spring 88, the shaft section 77D and the shaft section 78D enter inside the long hole portion 58B and are guided to the back side in the D direction. Then, the shaft section 77D and the shaft section 78D are regulated in the rotation thereof by coming into contact with the upper and lower inside wall surfaces of the long hole portion 58B, and are supported by the long hole portion 58B. Thus, as illustrated in FIG. 20, the outer cover 72 is in a state (upright state) of being along the W-H surface.

Figure 21:
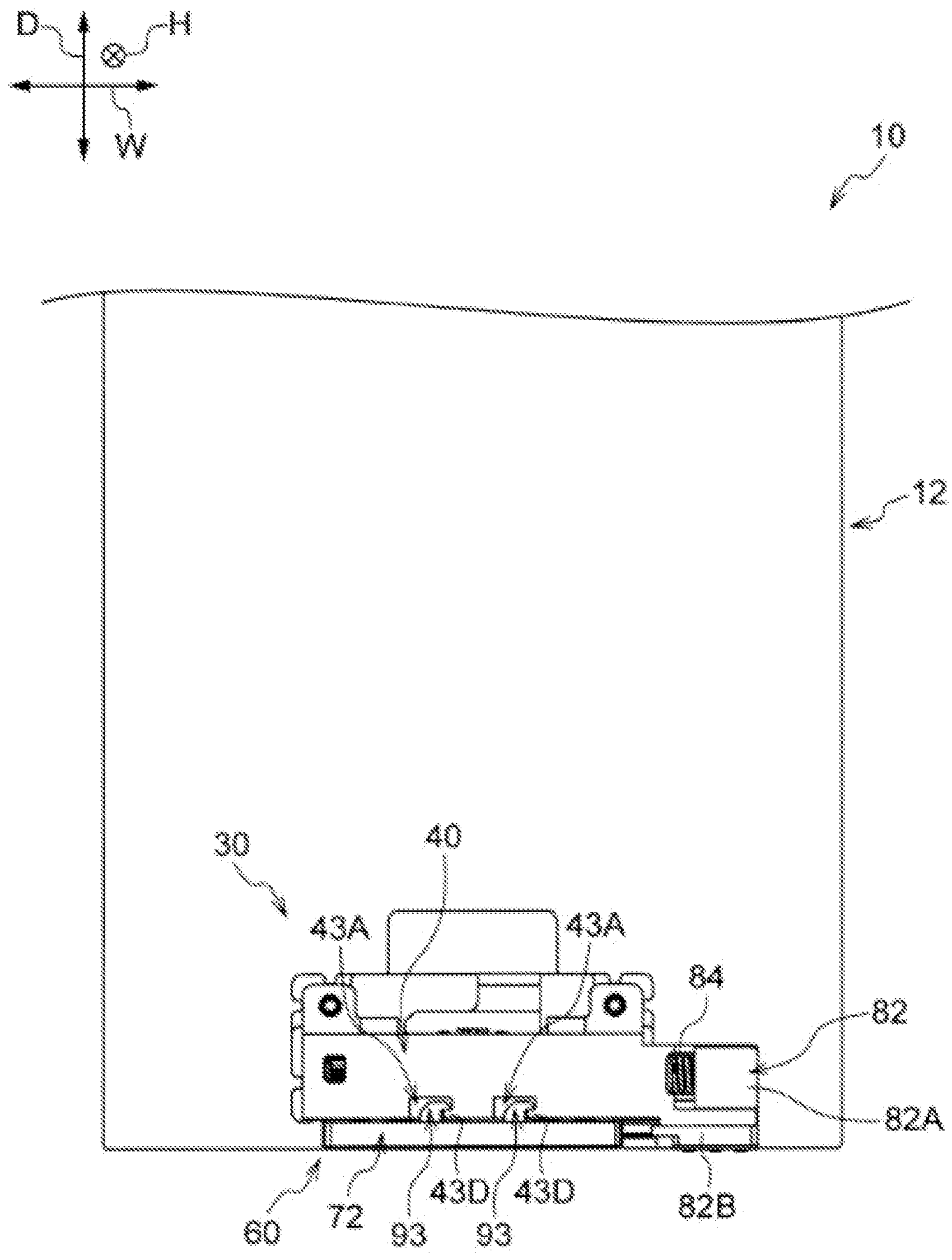
FIG. 21 is a partial plan view illustrating a locking state of the body member and the lock member according to the embodiment.
Figure 23:
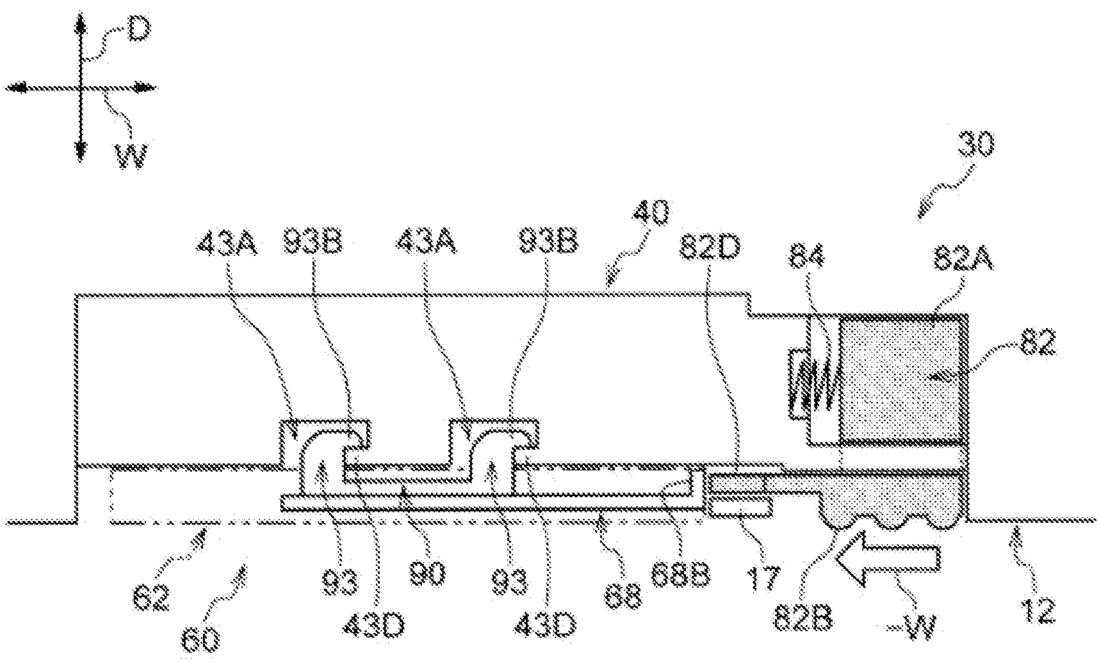
FIG. 23 is a partial plan view illustrating a state where a lock knob is slid according to the embodiment.
Figure 24:
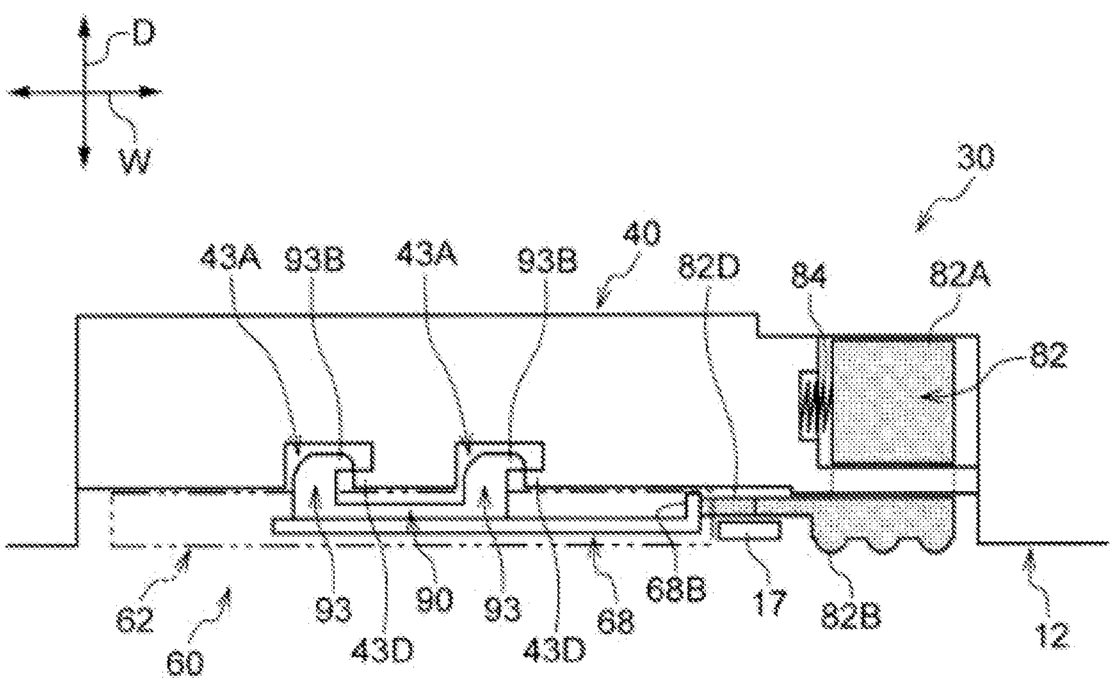
FIG. 24 is a partial plan view illustrating a state where the lock knob is slid and locking of the lock member is released with respect to the body member according to the embodiment.

As illustrated in FIG. 24, when the rotation frame 62 and the outer cover 72 are moved to the back side in the D direction, the locking section 93B of the claw section 93 is relatively moved with respect to the rotation frame 62 on the left side in the W direction and climbs the locked section 43D so as to turn the left end thereof in the W direction. Then, as illustrated in FIGS. 21 and 23, the claw section 93 is moved to the right side in the W direction by the biasing force of the spring material 74 (see FIG. 2) in two portions and is locked in the locked section 43D in two portions. Thus, even in a state where the biasing force of the torsion spring 88 (see FIG. 18) operates in the shaft section 77D (see FIG. 18), the lid section 60 is locked to the body member 40.

Even though not illustrated and described, the claw section 93 in two portions is locked to the locked section 43D in two portions also on the lower side of the body member 40 in the H direction. Furthermore, since the lock knob 82 is pressed to the right side in the W direction by the coil spring 84 and the holding member 68 is not moved to the left side, a locking state between the lid section 60 and the body member 40 is held (locking state is not released).

Figure 22:
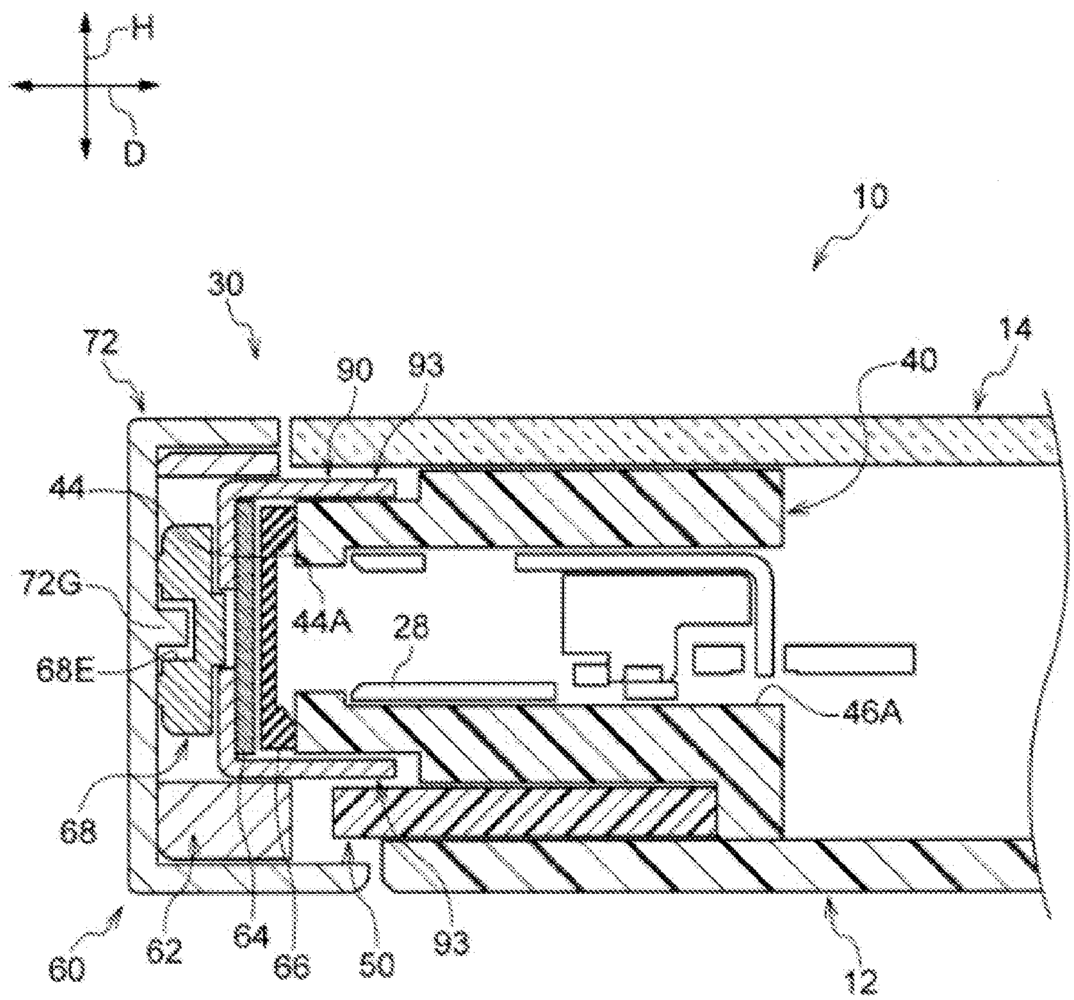
FIG. 22 is a vertical cross-sectional view illustrating the closed state of the lid section according to the embodiment.

When the lid section 60 is locked to the body member 40, as illustrated in FIG. 22, the packing 66 covers the opening 44A and is compressed in the D direction by coming into contact with the front side of the first front wall 44 in the upright state of the outer cover 72. Thus, the opening 44A is closed (waterproofed). The state where the packing 66 covers the opening 44A and is compressed in the D direction is referred to as the closed state of the lid section 60. Furthermore, a position in which the packing 66 covers the opening 44A is referred to as a closed position of the packing 66.

Opening operation of Opening

When the lid section 60 is opened in a closed state of the lid section 60 illustrated in FIG. 1, as illustrated in FIG. 23, the operation section 82B is mounted on the left side (indicated in arrow −W direction) in the W direction while resisting the biasing force of the coil spring 84.

Figure 25:
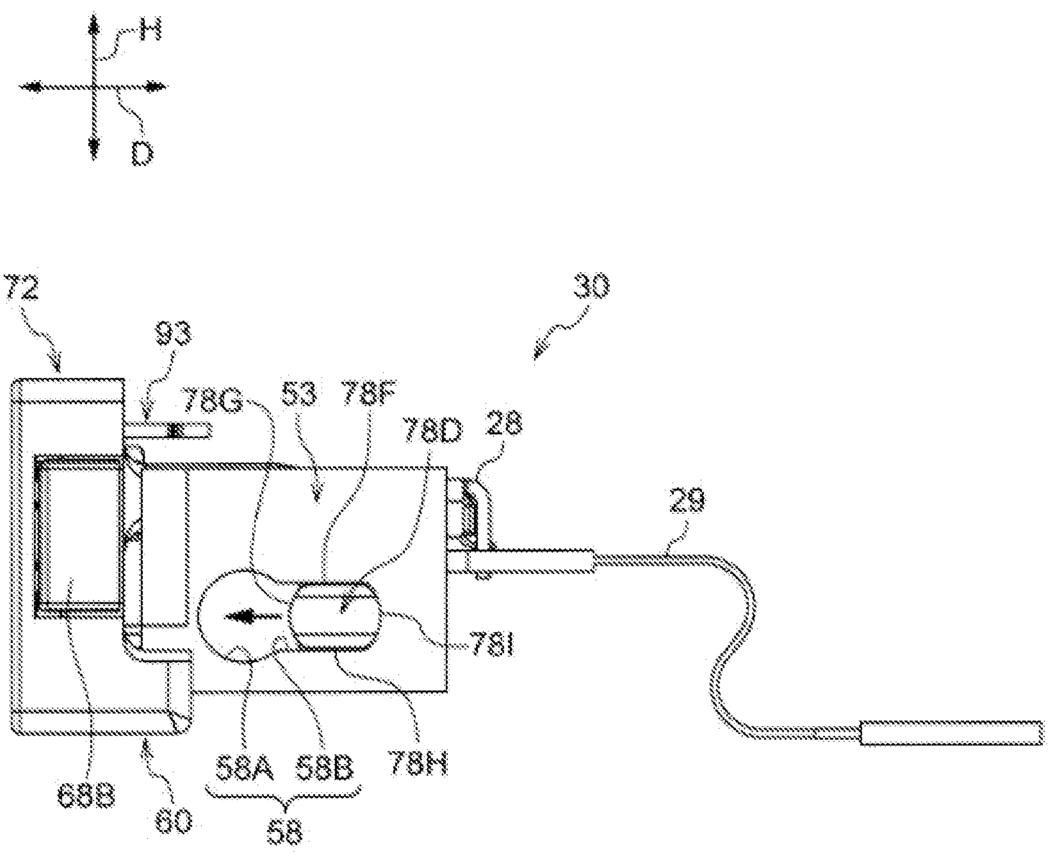
FIG. 25 is a right side view illustrating a closed state of the lid section according to the embodiment.

Subsequently, as illustrated in FIG. 24, when the operation section 82B of the lock knob 82 is moved to the left side in the W direction, the contact section 82D comes into contact with the bending section 68B and the holding member 68 and the lock member 90 are moved to the left side in the W direction. Thus, locking between the locking section 93B of the claw section 93 and the locked section 43D of the body member 40 is released and the lid section 60 may move to the front side in the D direction. At this time, as illustrated in FIG. 25, since the rotation of the shaft section 77D (see FIG. 18) and the shaft section 78D is regulated by contact with the long hole portion 58B, the lid section 60 is not rotated.

Figure 26:
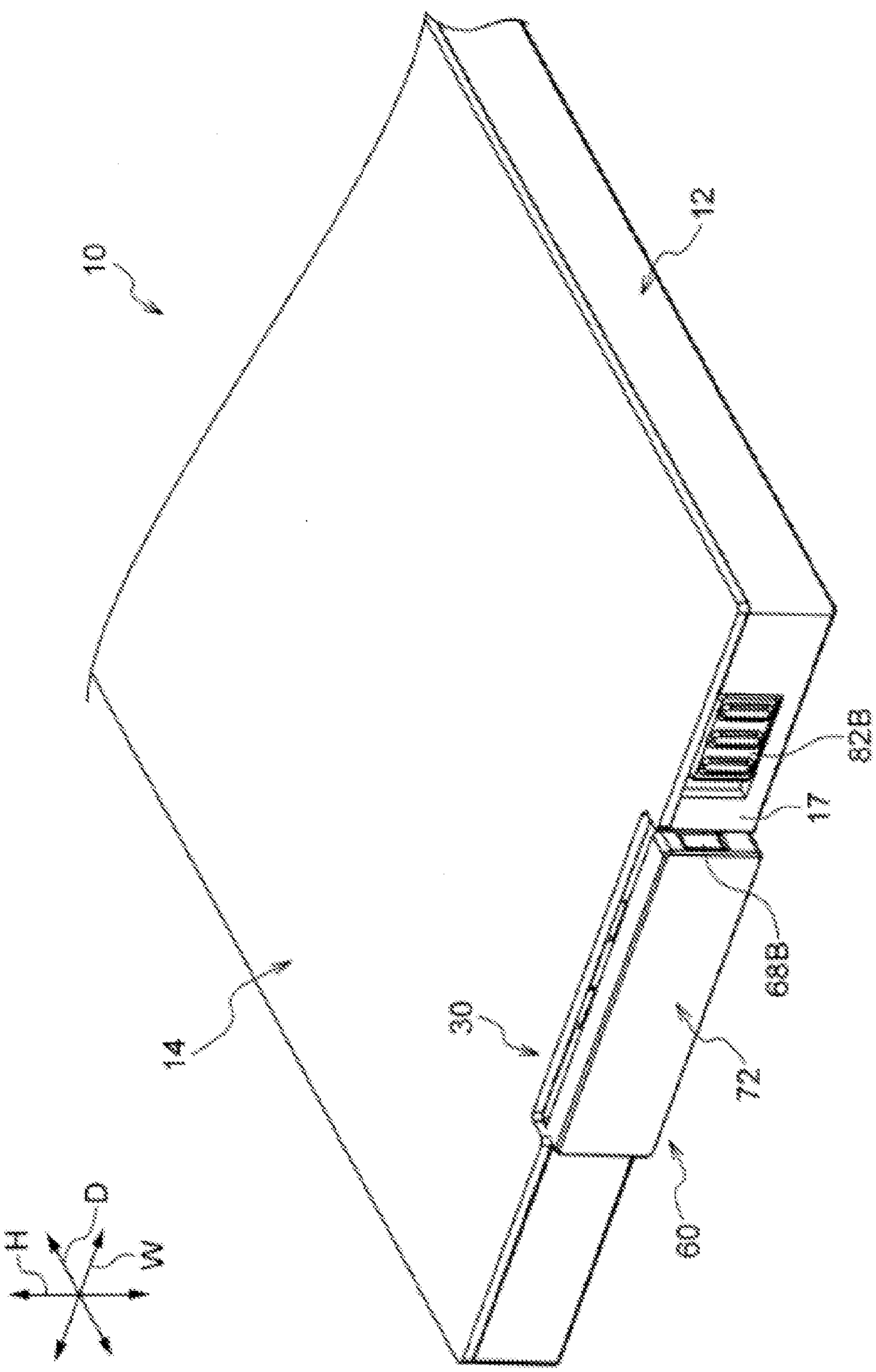
FIG. 26 is a partial perspective view illustrating a state where a lid member is slid on the front side according to the embodiment.
Figure 28:
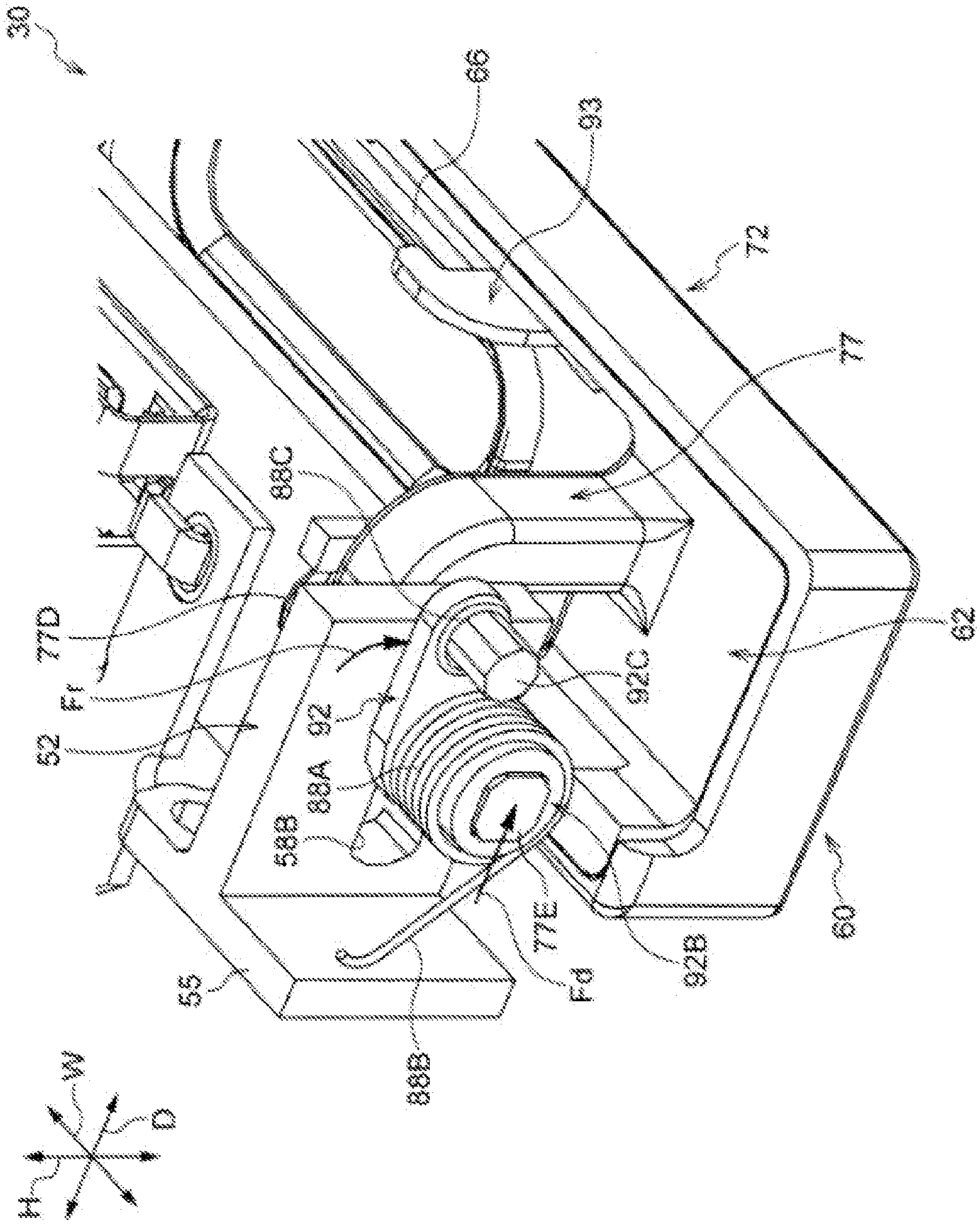
FIG. 28 is a partial perspective view illustrating a biasing state by the torsion spring according to the embodiment.

Here, as illustrated in FIG. 28, a biasing force Fd to the front side in the D direction is applied to the shaft section 77D by the first spring section 88B. Thus, the shaft section 77D is guided by the long hole portion 58B and is moved to the front side in the D direction. Furthermore, as illustrated in FIG. 25, the shaft section 78D is guided by the long hole portion 58B according to the movement of the shaft section 77D and is moved to the front side in the D direction. As illustrated in FIG. 26, the lid section 60 is moved to the front side with respect to the housing 12 in the D direction by the movement thereof.

Subsequently, as illustrated in FIG. 28, the shaft section 77D enters inside the circular hole portion 58A (see FIG. 20) and thereby the regulation of the rotation of the shaft section 77D is released. Furthermore, a biasing force Fr in the R direction (see FIG. 19) is applied to the shaft section 77D by the second spring section 88C. Thus, the shaft section 77D is guided by the circular hole portion 58A and is rotated in the R direction.

Figure 27:
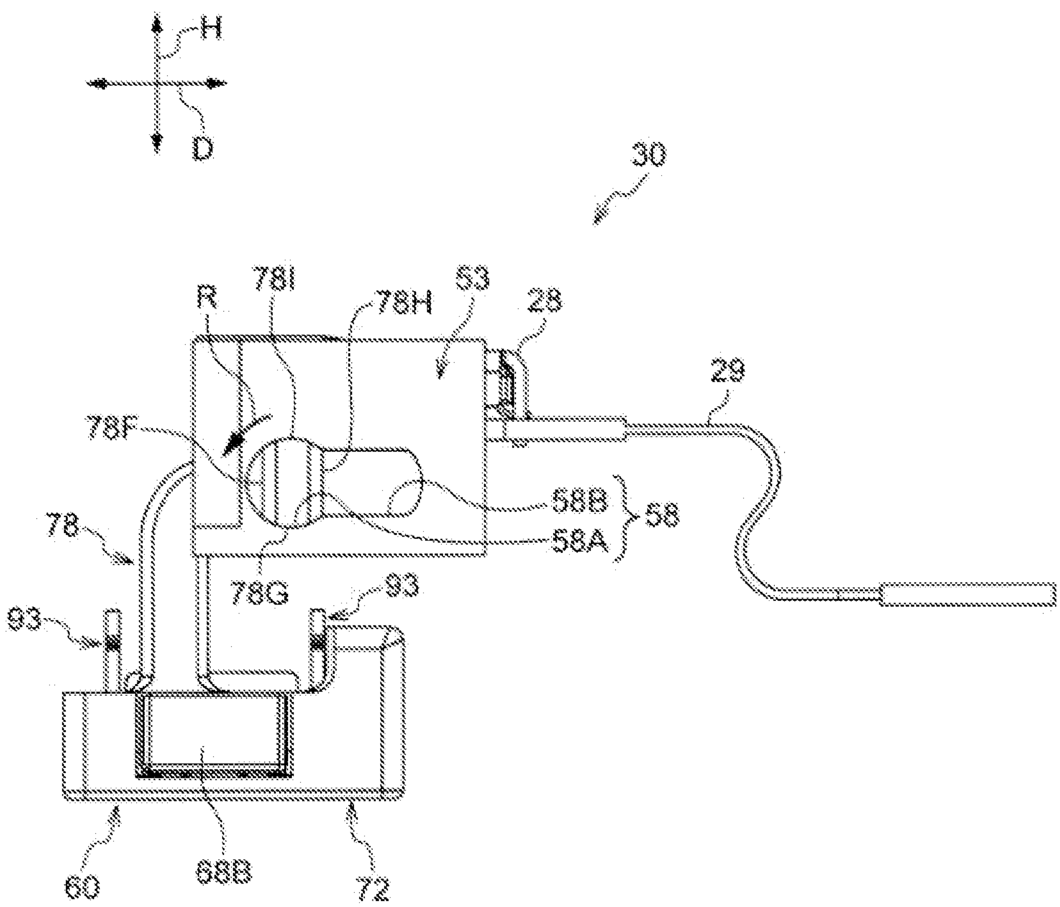
FIG. 27 is a right side view illustrating an open state of the lid section according to the embodiment.

Furthermore, as illustrated in FIG. 27, the shaft section 78D is guided by the circular hole portion 58A and is moved in the R direction according to the rotation of the shaft section 77D. As illustrated in FIG. 29, the lid section 60 is rotated and is disposed on the lower side of the housing 12, and the opening 44A is opened (open state) by the rotation operation thereof. Moreover, in the shaft section 77D and the shaft section 78D, the moving operation and the rotation operation are continuously performed on the front side in the D direction.

As described above, in the smartphone 10 and the lid open-close section 30, the shaft section 77D is biased to the front side in the D direction and in the R direction, by the first spring section 88B and the second spring section 88C. Thus, when the lid section 60 is moved to the closed position, since the biasing forces Fr and Fd applied to the shaft section 77D are resistance forces against the movement, the packing 66 is suppressed from coming into contact with a periphery (body member 40) of the opening 44A with a great force. Thus, since the packing 66 is suppressed from being damaged by action of an impact force on the packing 66, it is possible to suppress waterproof performance from being lowered.

Furthermore, in the smartphone 10 and the lid open-close section 30, since the sliding (movement in the D direction) and rotation of the shaft section 77D are guided by the shaft hole 58, an operation property of the lid section 60 is improved and a posture of the lid section 60 is maintained when the lid section 60 is closed compared to a case where the shaft section 77D is not guided. Thus, since the packing 66 is suppressed from being in a tilted state in the H direction and may uniformly come in contact with the periphery of the opening 44A, it is possible to suppress the waterproof performance from being lowered.

Specifically, as a comparison example, in a case where the opening 44A is closed only by rotating the lid section 60, the lower portion of the packing 66 comes into contact with the periphery of the opening 44A and thereafter the lower portion comes into contact therewith. Thus, in the comparison example, in a state where the packing 66 is tilted in the H direction, the packing 66 comes into contact with the periphery of the opening 44A and may not uniformly come into contact (be not evenly compressed) with the periphery of the opening 44A.

Meanwhile, in the smartphone 10 and the lid open-close section 30, after rotation of the shaft sections 77D and 78D, the shaft sections 77D and 78D are guided by the long hole portion 58B toward the body member 40. Thus, the packing 66 comes into contact with the periphery of the opening 44A in a state where a posture thereof is maintained with respect to the opening 44A. Thus, since the packing 66 may uniformly come into contact with the periphery of the opening 44A, it is possible to suppress the waterproof performance from being lowered.

Furthermore, in the smartphone 10 and the lid open-close section 30, the lid section 60 is moved to the closed position while resisting the biasing force Fd of the first spring section 88B and the biasing force Fr of the second spring section 88C. Here, as a comparison example, in a case where the torsion spring 88 is not present, the lid section 60 is moved in the closed position at once and the locking operation is difficult to be recognized by the lock member 90.

Meanwhile, in the smartphone 10 and the lid open-close section 30, the lid section 60 is gradually moved and the locking operation of the lock member 90 is recognized. That is, it is possible to strongly feel a locking feeling (click feeling) when the lid section 60 is locked to the body member 40 by the lock member 90. Thus, since the lid section 60 is recognized to be locked to the body member 40 through the lock member 90 and the closing operation is suppressed from being completed in a state where the lid section 60 is not locked to the body member 40, it is possible to suppress the waterproof performance from being lowered.

Furthermore, in the smartphone 10 and the lid open-close section 30, as illustrated in FIG. 15, one torsion spring 88 includes the first spring section 88B as an example of the first biasing section and the second spring section 88C as an example of the second biasing section. Thus, since a plurality of springs are not used, it is possible to reduce the size of the lid open-close section 30.

Furthermore, in the smartphone 10 and the lid open-close section 30, as illustrated in FIG. 18, the mounting member 92 is mounted on the shaft section 77D and the torsion spring 88 is mounted on the mounting member 92. Thus, since the mounting position of the torsion spring 88 is unlikely to be regulated, it is possible to improve the degree of freedom of the arrangement of the torsion spring 88 compared to a configuration in which the torsion spring 88 is directly mounted on the shaft section 77D.

In addition, in the smartphone 10 and the lid open-close section 30, as illustrated in FIGS. 22 and 23, in a closed state in which the packing 66 is compressed in the D direction, the lock member 90 is relatively moved with respect to the packing 66 in the W direction. Thus, since the packing 66 does not slide with respect to the first front wall 44 in the W direction, it is possible to suppress the packing 66 from being degraded by the sliding of the packing 66. Furthermore, since the degradation of the packing 66 is suppressed, it is possible to suppress the waterproof performance from being lowered.

Furthermore, in the smartphone 10 and the lid open-close section 30, as illustrated in FIG. 17, the lock member 90 has the slide plate 91 and the claw section 93. Thus, even if a portion to which the body member 40 is locked is small, locking is possible by using the claw section 93. Furthermore, even if the claw section 93 is small and the claw section 93 itself is unlikely to move, since the claw sections 93 are moved by sliding the slide plate 91, it is possible to improve the operation property of the locking member.

Furthermore, in the smartphone 10 and the lid open-close section 30, since the claw sections 93 are provided in the upper end and the lower end of the slide plate 91 and the claw sections 93 are locked to the body member 40 in the packing 66 in the up and down sides, it is possible to evenly compress the packing 66 in the H direction. In addition, in the smartphone 10 and the lid open-close section 30, since a plurality (as an example, two portions) of claw sections 93 are provided and the claw sections 93 are locked to the body member 40 in the right and left sides of the packing 66, it is also possible to evenly compress the packing 66 in the W direction.

Furthermore, in the smartphone 10 and the lid open-close section 30, the claw section 93 has the locking section 93B protruding in the W direction. Thus, since a locking area in the W direction may be widened, it is possible to hold the locking state between the claw section 93 and the body member 40.

Furthermore, in the smartphone 10 and the lid open-close section 30, as illustrated in FIG. 2, the slide plate 91 is disposed between the rotation frame 62 and the mounting frame 64. Thus, since the slide plate 91 is held between the rotation frame 62 and the mounting frame 64 without separately providing a member for holding (guiding) the slide plate 91, it is possible to hold the slide plate 91 with a simple configuration.

In addition, in the smartphone 10 and the lid open-close section 30, as illustrated in FIG. 29, the arm sections 77 and 78 are bent at an angle of 90 degrees. Thus, when the lid section 60 disposed in the front surface in the closed position is moved to the open position of the opening 44A, the lid section 60 is disposed below the housing 12. Thus, when a connector (not illustrated) is connected to or separated from the jack 28, it is possible to suppress the lid section 60 from interfering with the operation.

Furthermore, in the smartphone 10 and the lid open-close section 30, as illustrated in FIG. 14, the holding member 68 accommodated in the accommodation section 76A holds the slide plate 91 and is biased by the spring material 74 in the W direction. Thus, since the slide plate 91 is not directly biased by the spring material 74, it is possible to bias the slide plate 91 by the spring material 74 regardless of the thickness of the slide plate 91. Furthermore, in the smartphone 10 and the lid open-close section 30, since two spring materials 74 are provided in the H direction, it is possible to reduce the diameter of the spring material 74 compared to a case where one spring material having a large diameter is used. Thus, it is possible to reduce the size of the lid open-close section 30.

In addition, in the smartphone 10 and the lid open-close section 30, as illustrated in FIG. 14, the spring material 74 is a coil spring and is held by being disposed in the recessed section 76C. Thus, since the posture of the spring material 74 is held in the recessed section 76C, it is possible to stabilize the direction in which the biasing force of the spring material 74 acts.

Furthermore, in the smartphone 10 and the lid open-close section 30, as illustrated in FIG. 24, the holding member 68 is moved and the locking state between the claw section 93 and the body member 40 is released by operating the operation section 82B of the lock knob 82. That is, since the locking state of the claw section 93 with respect to the body member 40 is indirectly released, it is possible to suppress the claw section 93 from degrading compared to a case where the claw section 93 is directly moved. Furthermore, since the operation section 82B is in a position separated from the claw section 93 in the W direction, it is possible to suppress the thickness of the lid open-close section 30 from increasing.

In addition, in the smartphone 10 and the lid open-close section 30, since the coil spring 84 biases the lock knob 82 to the right side in the W direction, when the operation section 82B is not being operated, the lock knob 82 is held on the right side in the W direction. Thus, when release of the locking state by the claw section 93 is not desired, it is possible to inhibit the locking state of the lock knob 82 from being released.

Furthermore, in the smartphone 10 and the lid open-close section 30, as illustrated in FIG. 4, since the rotation frame 62 and the holding member 68 are covered by the outer cover 72, it is possible to improve the appearance compared to a case where the holding member 68 is exposed.

Furthermore, in the smartphone 10 and the lid open-close section 30, as illustrated in FIG. 19, the left side wall 52 and the right side wall 53 are disposed on the both right and left sides of the jack 28, and the shaft sections 77D and 78D are guided to both right and left sides of the jack 28 in the D direction. Thus, since a desired arrangement region is small in the D direction, it is possible to reduce the size of the smartphone 10 compared to a case where the left side wall 52 and the right side wall 53 are disposed on the front side of the jack 28 in the D direction.

Next, modified examples of the embodiment will be described.

In the embodiment described above, as an example of the electronic apparatus, the smartphone 10 is described. However, the electronic apparatus is not limited to the smartphone 10 and, for example, mobile devices such as a mobile phone, a camera, and a portable audio reproducing device, a personal computer, an audio apparatus, a tablet terminal, and the like may be included.

The jack 28 is not limited to the jack 28 for the USB and may be a connector performing electrical connection to an earphone jack or another external device. The lid open-close section 30 is not limited to one that is provided on the front side of the housing 12 and may be provided in the right and left side portions or on the back side.

The body member 40 is not limited to one that is mounted on the housing 12 and may be integrally formed with the housing 12. Furthermore, the body member 40 is not limited to one in which the guide frame 50 is mounted from the lower side and may be mounted from the upper side. Furthermore, the locked section 43D may be a protrusion protruding from the body member 40 in the H direction. Furthermore, in the locked section 43D, in order to smoothly perform the operations of the locking and the release of the locking, the corners may be chamfered. The shape of the opening 44A is not limited to the rectangular shape and may be a circular shape, an elliptical shape, or other polygonal shapes.

In the guide frame 50, if the shaft section 78D is biased by the torsion spring 88, the first back wall 55 may be provided on the back side of the right side wall 53. Furthermore, in the guide frame 50, the first back wall 55 may be provided on the back side of the left side wall 52 and the back side of the right side wall 53.

The outer shape of the lid section 60 is not limited to the rectangular shape viewed in the D direction and may be a circular shape, an elliptical shape, or other polygonal shapes. The lid section 60 is not limited to one moving below the housing 12 and may move above the housing 12.

The rotation frame 62 is not limited to one in which the arm sections 77 and 78 are bent and may have linear arm sections. Furthermore, if the holding member 68 is not used, the rotation frame 62 may not have the accommodation section 76A and the recessed section 76C.

The mounting frame 64 may be formed separated from the packing 66. Then, the packing 66 may be mounted on the mounting frame 64 using the adhesive. As the packing 66, the waterproof member is not limited to one that has the fixing section 66A and the peripheral edge section 66B, and may have only the peripheral edge section 66B. Furthermore, the waterproof member is not limited to one that is formed in the closed curve shape and the outer shape may be a polygonal shape.

The holding member 68 may be a rectangular parallelepiped shape having no bending section 68B. The outer cover 72 may be only the front wall 72A. The number of spring material 74 is not limited to two and the number of spring material may be one or a plurality of three or more. Furthermore, the spring material 74 is not limited to the coil spring and may be another elastic member such as a leaf spring.

The lock knob 82 is not limited to one in which the operation section 82B is positioned in the side surface on the front side of the housing 12 and may be operated by exposing to the upper surface or the lower surface on the front side of the housing 12. The number of coil spring 84 is not limited to one and the number of coil springs may be a plurality. Furthermore, another elastic member such as a leaf spring may be used instead of the coil spring 84.

The first biasing section and the second biasing section are not limited to one that is integrally formed as the torsion spring 88 and may be separate members. For example, biasing in the D direction may be performed by the coil spring and the biasing in the rotation direction may be performed by the torsion spring with respect to the shaft sections 77D and 78D.

In the lock member 90, the number of the claw sections 93 is not limited to four and may be one, two, three, and five or more. Furthermore, the number of the claw sections 93 may vary in the vertical direction.

The protrusion section 92C of the mounting member 92 is not limited to the prismatic shape and may be a cylindrical shape.

Moreover, in a plurality of modified examples described above, the modified examples capable of being combined may be implemented by being appropriately combined.

The foregoing has described one embodiment of the technology disclosed in the present application, but the technology disclosed in the present application is not limited to the above description and, of course, is implemented with various modifications without departing from the gist thereof within a range outside the above description.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A waterproof structure comprising:

a body member in which an opening is formed;

a lid member that includes a waterproof member that inhibits water from entering through the opening;

a guide member which is provided in the body member and in which a shaft hole including a circular hole portion and a long hole portion communicating with the circular hole portion is formed;

a shaft section that is provided in the lid member, is supported in the shaft hole, is rotated inside the circular hole portion, is regulated in the rotation thereof inside the long hole portion, and is guided to the body member side;

a first biasing section that biases the shaft section in a removing direction away from the body member;

a second biasing section that biases the shaft section in a rotation direction;

a locking member that locks the lid member to the body member in a state where the waterproof member inhibits water from entering through the opening; and a torsion spring that includes the first biasing section and the second biasing section, and is mounted on a periphery of the shaft section, wherein a wall section in which the shaft hole is formed and which is provided in the removing direction, and an extension section which extends from the wall section in an intersecting direction intersecting the removing direction are formed in the guide member, wherein a mounting member including a plate section that is disposed along the wall section, a fitting section into which the shaft section formed is fitted on the plate section, and a protrusion section that protrudes from the plate section in the intersecting direction are mounted on the shaft section, and wherein the torsion spring is provided in the fitting section, the first biasing section comes into contact with the extension section, and the second biasing section is mounted on the protrusion section.

2. The waterproof structure according to claim 1, wherein the locking member relatively moves with respect to the lid member in the intersecting direction intersecting the removing direction and locks the lid member to the body member.

3. The waterproof structure according to claim 2, wherein the locking member has a slide plate that is slidably held in the lid member and claw bodies that protrude from the slide plate in the removing direction and lock the lid member to the body member.

4. The waterproof structure according to claim 3, wherein the claw bodies are provided in an upper end and a lower end of the slide plate in a height direction intersecting the intersecting direction and the removing direction.

5. The waterproof structure according to claim 3, wherein a plurality of claw bodies are provided in the intersecting direction.

6. The waterproof structure according to claim 3, wherein the claw body has a locking section protruding in the intersecting direction, and wherein the body member has a locked section to which the locking section is locked.

7. The waterproof structure according to claim 3, wherein the lid member includes a mounted member provided in the waterproof member, and a fixing member to which the mounted member is fixed and in which the shaft section is formed, and wherein the slide plate is disposed between the mounted member and the fixing member.

8. The waterproof structure according to claim 7, wherein an arm section that includes a shaft section, extends from the fixing member in the removing direction, and is bent in the height direction intersecting the intersecting direction and the removing direction is formed in the fixing member.

9. The waterproof structure according to claim 7, wherein a holding member that holds the slide plate is provided, wherein an accommodation section that accommodates the holding member is formed in the fixing member, and wherein a biasing member that biases the holding member to a side in which the claw body is locked to the body member is provided in the accommodation section.

10. The waterproof structure according to claim 9, wherein a plurality of biasing members are provided at an interval in the height direction intersecting the intersecting direction and the removing direction.

11. The waterproof structure according to claim 9, wherein the biasing member is a coil spring, and wherein a recessed section accommodating the coil spring is formed in the fixing member.

12. The waterproof structure according to claim 9, wherein a bending section that is bent to the body member is formed in an end portion of the holding member, and wherein a releasing member that relatively moves with respect to the body member, comes into contact with the bending section, and releases the locking between the claw body and the body member is provided in the body member.

13. The waterproof structure according to claim 12, wherein a pressing member that presses the releasing member on a side on which the claw body is locked to the body member in the intersecting direction is provided in the body member.

14. The waterproof structure according to claim 9, wherein a cover member that covers the fixing member and the holding member is mounted on the fixing member.

15. An electronic apparatus comprising:

a housing;

a body member in which an opening provided in the housing is formed;

a lid member that includes a waterproof member that inhibits water from entering through an opening;

a guide member which is provided in the body member and in which a shaft hole including a circular hole portion and a long hole portion communicating with the circular hole portion is formed;

a shaft section that is provided in the lid member, is supported in the shaft hole, is rotated inside the circular hole portion, is regulated in the rotation thereof inside the long hole portion, and is guided to the body member side;

a first biasing section that biases the shaft section in a removing direction away from the body member;

a second biasing section that biases the shaft section in a rotation direction;

a locking member that locks the lid member to the body member in a state where the waterproof member inhibits water from entering through the opening;

a connection member that is electrically connected to an electronic component provided inside the housing and is disposed further toward back side than the opening; and a torsion spring that includes the first biasing section and the second biasing section, and is mounted on a periphery of the shaft section, wherein a wall section in which the shaft hole is formed and which is provided in the removing direction, and an extension section which extends from the wall section in an intersecting direction intersecting the removing direction are formed in the guide member, wherein a mounting member including a plate section that is disposed along the wall section, a fitting section into which the shaft section formed is fitted on the plate section, and a protrusion section that protrudes from the plate section in the intersecting direction are mounted on the shaft section, and wherein the torsion spring is provided in the fitting section, the first biasing section comes into contact with the extension section, and the second biasing section is mounted on the protrusion section.

16. The electronic apparatus according to claim 15, wherein the locking member relatively moves with respect to the lid member in the intersecting direction intersecting the removing direction and locks the lid member to the body member.

* * * * *